United States Patent
Kikuchi et al.

(10) Patent No.: US 7,734,453 B2
(45) Date of Patent: Jun. 8, 2010

(54) PROCESS OF ESTIMATING RELATIONSHIP BETWEEN ELEMENT DISTORTION AND ANALYSIS ERROR

(75) Inventors: Noboru Kikuchi, Nisshin (JP); Minako Sekiguchi, Ann Arbor, MI (US); Hiroo Yamaoka, Toyota (JP); Hiroyuki Umetani, Nagoya (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 1010 days.

(21) Appl. No.: 10/543,928

(22) PCT Filed: Mar. 16, 2004

(86) PCT No.: PCT/JP2004/003510

§ 371 (c)(1),
(2), (4) Date: May 24, 2006

(87) PCT Pub. No.: WO2004/084101

PCT Pub. Date: Sep. 30, 2004

(65) Prior Publication Data

US 2006/0288255 A1    Dec. 21, 2006

(30) Foreign Application Priority Data

Mar. 17, 2003    (JP)    ............... 2003-072660

(51) Int. Cl.
    *G06G 7/48*    (2006.01)
(52) U.S. Cl. .......................................... 703/6
(58) Field of Classification Search ......... 703/1, 703/2, 6
    See application file for complete search history.

(56) References Cited

U.S. PATENT DOCUMENTS 5,315,537 A * 5/1994 Blacker ................ 716/20

(Continued)

FOREIGN PATENT DOCUMENTS

JP    4-268674    9/1992

(Continued)

OTHER PUBLICATIONS

"An Element-Level Error Estimator for Mesh Refinement of Finite Element Models" by Keating et al, Collection of Technical Papers. 36th AIAA/ASME/ASCE/AHS/ASC Structures, Structural Dynamics, and Materials Conference and AIAA/ASME/AHS Adaptive Structures Forum, Apr. 10-13, 1995, Part 2, p. 1280-1288.*

(Continued)

*Primary Examiner*—Paul L Rodriguez
*Assistant Examiner*—Russ Guill
(74) *Attorney, Agent, or Firm*—Oblon, Spivak, McClelland, Maier & Neustadt, L.L.P.

(57) ABSTRACT

A process is disclosed for estimating by a computer a relationship between geometric distortion of an element used for approximately representing the shape of an object to be analyzed by a finite element method, and an analysis error which occurs, due to the geometric distortion of the element, in analysis results of the object by the finite element method. The process includes: assuming at least one deformation mode occurring in the element upon deformation of the object, in the form of at least one of tension, bending, shear, and torsion; and estimating the analysis error associated with the geometric distortion, for each of the at least one assumed deformation mode.

9 Claims, 45 Drawing Sheets

U.S. PATENT DOCUMENTS 7,027,048 B2 * 4/2006 Brombolich ................ 345/420
7,363,198 B2 * 4/2008 Balaniuk et al. ................ 703/2

FOREIGN PATENT DOCUMENTS

JP          11-25292          1/1999

OTHER PUBLICATIONS

B.L. Croft, "A method of self adaptive rezoning for the case of large deformation finite element problems utilizing rezoning indicators derived from eigenvalue testing", 1992, Naval Command, Control and Ocean Surveillance Center, pp. 1-293.*

K Mallikarjuna Rao et al., "A set of pathological tests to validate new finite elements", Dec. 2001, Sadhana, vol. 26, pp. 549-590.*

Barna Szabo et al., "Finite element analysis", 1991, John Wiley & Sons, pp. 290-293, 344-350.*

J.E. Akin, "Finite elements for analysis and design", 1994, Academic Press, pp. 62-66.*

Susanne C. Brenner et al., "The mathematical theory of finite element methods", 2002, Springer, p. 235.*

Akira Tezuka, English translation of "Adaptive Mesh Control In Finite Element Method", 1999, Simulation, vol. 18, No. 2, pp. 1-27.*

H.S. Oh et al., "A simple distortion error estimator for size and distortion of 2D isoparametric finite elements", 1996, Computers & Structures, vol. 59, No. 6, pp. 989-999.*

Akira Tezuka, "Adaptive Mesh Control in Finite Element Method, Simulation", Kabushiki Kaisha Nittetsu Technology Information Center, vol. 18, No. 2, Jun. 1999, pp. 26-34, (with English Abstract).

* cited by examiner 1.1
$$x(\xi,\eta) = \sum_{i=1}^{4} N_i(\xi,\eta) x_i = a_0^x + a_1^x \xi + a_2^x \eta + a_3^x \xi\eta$$
$$y(\xi,\eta) = \sum_{i=1}^{4} N_i(\xi,\eta) y_i = a_0^y + a_1^y \xi + a_2^y \eta + a_3^y \xi\eta$$

1.2
$$N_i(\xi,\eta) = \frac{1}{4}(1+\xi_i\xi)(1+\eta_i\eta)$$

1.3
$$a_0^x = \frac{1}{4}\mathbf{h}_0^T\mathbf{x} = \frac{1}{4}\sum_{i=1}^{4} x_i \qquad a_0^y = \frac{1}{4}\mathbf{h}_0^T\mathbf{y} = \frac{1}{4}\sum_{i=1}^{4} y_i$$
$$a_1^x = \frac{1}{4}\mathbf{h}_1^T\mathbf{x} = \frac{1}{4}\sum_{i=1}^{4} \xi_i x_i \qquad a_1^y = \frac{1}{4}\mathbf{h}_1^T\mathbf{y} = \frac{1}{4}\sum_{i=1}^{4} \xi_i y_i$$
$$a_2^x = \frac{1}{4}\mathbf{h}_2^T\mathbf{x} = \frac{1}{4}\sum_{i=1}^{4} \eta_i x_i \qquad a_2^y = \frac{1}{4}\mathbf{h}_2^T\mathbf{y} = \frac{1}{4}\sum_{i=1}^{4} \eta_i y_i$$
$$a_3^x = \frac{1}{4}\mathbf{h}_3^T\mathbf{x} = \frac{1}{4}\sum_{i=1}^{4} \xi_i\eta_i x_i \qquad a_3^y = \frac{1}{4}\mathbf{h}_3^T\mathbf{y} = \frac{1}{4}\sum_{i=1}^{4} \xi_i\eta_i y_i$$

Fig. 1

1.4 $\quad \mathbf{h}_0 = \begin{Bmatrix} 1 \\ 1 \\ 1 \\ 1 \end{Bmatrix}, \quad \mathbf{h}_1 = \begin{Bmatrix} -1 \\ 1 \\ 1 \\ -1 \end{Bmatrix}, \quad \mathbf{h}_2 = \begin{Bmatrix} -1 \\ -1 \\ 1 \\ 1 \end{Bmatrix}, \quad \mathbf{h}_3 = \begin{Bmatrix} 1 \\ -1 \\ 1 \\ -1 \end{Bmatrix}$ 1.5 $\quad \mathbf{x} = \begin{Bmatrix} x_1 \\ x_2 \\ x_3 \\ x_4 \end{Bmatrix}, \quad \mathbf{y} = \begin{Bmatrix} y_1 \\ y_2 \\ y_3 \\ y_4 \end{Bmatrix}$ 1.6 $\quad \mathbf{J}(\xi,\eta) = \begin{bmatrix} \dfrac{\partial x}{\partial \xi} & \dfrac{\partial y}{\partial \xi} \\ \dfrac{\partial x}{\partial \eta} & \dfrac{\partial y}{\partial \eta} \end{bmatrix} = \begin{bmatrix} j_{11} & j_{12} \\ j_{21} & j_{22} \end{bmatrix} = \begin{bmatrix} a_1^x + a_3^x \eta & a_1^y + a_3^y \eta \\ a_2^x + a_3^x \xi & a_2^y + a_3^y \xi \end{bmatrix}$

Fig. 2

1.7
$$[\bar{x}_0 \quad \bar{y}_0] = [h_x \mathbf{h}_1 \quad h_y \mathbf{h}_2]$$
$$[\bar{x}_1 \quad \bar{y}_1] = [h_x \mathbf{h}_1 + \alpha_1 \mathbf{h}_2 \quad h_y \mathbf{h}_2]$$
$$[\bar{x}_2 \quad \bar{y}_2] = [h_x \mathbf{h}_1 \quad h_y \mathbf{h}_2 + \alpha_2 \mathbf{h}_1]$$
$$[\bar{x}_3 \quad \bar{y}_3] = [h_x \mathbf{h}_1 + \alpha_3 \mathbf{h}_3 \quad h_y \mathbf{h}_2]$$
$$[\bar{x}_4 \quad \bar{y}_4] = [h_x \mathbf{h}_1 \quad h_y \mathbf{h}_2 + \alpha_4 \mathbf{h}_3]$$

1.8
$$[x_0 \quad y_0] = [\bar{x}_0 \quad \bar{y}_0]$$
$$[x_i \quad y_i] = [\bar{x}_i \quad \bar{y}_i] - [\bar{x}_0 \quad \bar{y}_0], \quad i = 1, 2, 3, 4$$

1.9
$$[x_0 \quad y_0] = [h_x \mathbf{h}_1 \quad h_y \mathbf{h}_2]$$
$$[x_1 \quad y_1] = [\alpha_1 \mathbf{h}_2 \quad 0]$$
$$[x_2 \quad y_2] = [0 \quad \alpha_2 \mathbf{h}_1]$$
$$[x_3 \quad y_3] = [\alpha_3 \mathbf{h}_3 \quad 0]$$
$$[x_4 \quad y_4] = [0 \quad \alpha_4 \mathbf{h}_3]$$

1.10
$$\mathbf{x} = \sum_{i=1}^{4} x_i = h_x \mathbf{h}_1 + \alpha_1 \mathbf{h}_2 + \alpha_3 \mathbf{h}_3$$
$$\mathbf{y} = \sum_{i=1}^{4} y_i = h_y \mathbf{h}_2 + \alpha_2 \mathbf{h}_1 + \alpha_4 \mathbf{h}_3$$

Fig. 4

1.11
$$\{a_0^x \ a_1^x \ a_2^x \ a_3^x\} = \{0 \ h_x \ \alpha_1 \ \alpha_3\}$$
$$\{a_0^y \ a_1^y \ a_2^y \ a_3^y\} = \{0 \ \alpha_2 \ h_y \ \alpha_4\}$$

1.12
$$x(\xi,\eta) = \sum_{i=1}^{4} N_i(\xi,\eta) x_i = x_0 + h_x\xi + \underbrace{\alpha_1}_{\text{skew in } x}\eta + \underbrace{\alpha_3}_{\text{trapezoid in } x}\xi\eta$$
$$y(\xi,\eta) = \sum_{i=1}^{4} N_i(\xi,\eta) y_i = y_0 + \underbrace{\alpha_2}_{\text{skew in } y}\xi + h_y\eta + \underbrace{\alpha_4}_{\text{trapezoid in } y}\xi\eta$$

1.13
$$h_x = \frac{1}{4}\mathbf{h}_1^T\mathbf{x}, \quad \alpha_1 = \frac{1}{4}\mathbf{h}_2^T\mathbf{x}, \quad \alpha_3 = \frac{1}{4}\mathbf{h}_3^T\mathbf{x}$$
$$h_y = \frac{1}{4}\mathbf{h}_2^T\mathbf{y}, \quad \alpha_2 = \frac{1}{4}\mathbf{h}_1^T\mathbf{y}, \quad \alpha_4 = \frac{1}{4}\mathbf{h}_3^T\mathbf{y}$$

1.14
$$\mathbf{x} = x_0\mathbf{h}_0 + h_x\mathbf{h}_1 + \alpha_1\mathbf{h}_2 + \alpha_3\mathbf{h}_3 = \frac{1}{4}\underbrace{\left(\sum_{i=0}^{3}\mathbf{h}_i\mathbf{h}_i^T\right)}_{=I}\mathbf{x}$$
$$\mathbf{y} = y_0\mathbf{h}_0 + h_y\mathbf{h}_2 + \alpha_2\mathbf{h}_1 + \alpha_4\mathbf{h}_3 = \frac{1}{4}\underbrace{\left(\sum_{i=0}^{3}\mathbf{h}_i\mathbf{h}_i^T\right)}_{=I}\mathbf{y}$$

Fig. 5

1.15 $$\{X_0 \quad Y_0\} = \frac{1}{4}\{\mathbf{h}_0^T \mathbf{X} \quad \mathbf{h}_0^T \mathbf{Y}\}$$

1.16 $$\mathbf{P}_{24} = \left\{ \begin{array}{c} \frac{X_2+X_3}{2} - \frac{X_4+X_1}{2} \\ \frac{Y_2+Y_3}{2} - \frac{Y_4+Y_1}{2} \end{array} \right\} = \frac{1}{2}\left\{ \begin{array}{c} \mathbf{h}_1^T \mathbf{X} \\ \mathbf{h}_1^T \mathbf{Y} \end{array} \right\}$$

$$\mathbf{P}_{31} = \left\{ \begin{array}{c} \frac{X_3+X_4}{2} - \frac{X_1+X_2}{2} \\ \frac{Y_3+Y_4}{2} - \frac{Y_1+Y_2}{2} \end{array} \right\} = \frac{1}{2}\left\{ \begin{array}{c} \mathbf{h}_2^T \mathbf{X} \\ \mathbf{h}_2^T \mathbf{Y} \end{array} \right\}$$

1.17 $$\mathbf{e}_x = \frac{\mathbf{P}_{24}}{|\mathbf{P}_{24}|}, \quad \mathbf{e}_y = \frac{\mathbf{P}_{24}^\perp}{|\mathbf{P}_{24}^\perp|}$$

1.18 $$\mathbf{P}_{24}^\perp = \left\{ \begin{array}{c} \frac{Y_2+Y_3}{2} - \frac{Y_4+Y_1}{2} \\ -\frac{X_2+X_3}{2} + \frac{X_4+X_1}{2} \end{array} \right\} = \frac{1}{2}\left\{ \begin{array}{c} \mathbf{h}_1^T \mathbf{Y} \\ -\mathbf{h}_1^T \mathbf{X} \end{array} \right\}$$

Fig. 7

1.19 $\quad \mathbf{r}_{xy} = \begin{Bmatrix} x_i \\ y_i \end{Bmatrix} = \begin{bmatrix} e_{xX} & e_{xY} \\ e_{yX} & e_{yY} \end{bmatrix} \begin{Bmatrix} X_i - X_0 \\ Y_i - Y_0 \end{Bmatrix} = \mathbf{T}^T \mathbf{r}_{XY}, \quad i = 1,2,3,4$

Fig. 8

|  | Node1 | Node2 | Node3 | Node4 | Origin | $e_x$ | $e_y$ |
|---|---|---|---|---|---|---|---|
| $X_i$ | -2.5 | 4 | 0.5 | -1.5 | 0.125 | 0.9898 | -0.1425 |
| $Y_i$ | -2 | -1.5 | 1 | 1.5 | -0.25 | 0.1425 | 0.9898 |

Fig. 9

|  | Node1 | Node2 | Node3 | Node4 |
|---|---|---|---|---|
| $x_i$ | -2.8476 | 3.6573 | 0.5493 | -1.3590 |
| $y_i$ | -1.3580 | -1.7896 | 1.1838 | 1.9638 |

Fig. 10

1.20
$$J(\xi,\eta) = \begin{bmatrix} h_x + \alpha_3\eta & \alpha_2 + \alpha_4\eta \\ \alpha_1 + \alpha_3\xi & h_y + \alpha_4\xi \end{bmatrix}$$

1.21
$$J(\xi,\eta) = \underbrace{\begin{bmatrix} h_x & 0 \\ 0 & h_y \end{bmatrix}}_{\text{related to aspect ratio}} + \underbrace{\begin{bmatrix} 0 & \alpha_2 \\ \alpha_1 & 0 \end{bmatrix}}_{\text{related to skew geometry}} + \underbrace{\begin{bmatrix} \alpha_3\eta & \alpha_4\eta \\ \alpha_3\xi & \alpha_4\xi \end{bmatrix}}_{\text{related to trapezoidal geometry}}$$

Fig. 13

1.22 $$J(\xi,\eta) = \det[\mathbf{J}] = J_0 + J_1\xi + J_2\eta$$

1.23 $$\begin{aligned}J_0 &= h_x h_y - \alpha_1\alpha_2 \\ J_1 &= h_x\alpha_4 - \alpha_2\alpha_3 \\ J_2 &= h_y\alpha_3 - \alpha_1\alpha_4\end{aligned}$$

1.24 $$J(\xi,\eta) = \left(\underbrace{h_x h_y}_{\text{aspect ratio}} - \underbrace{\alpha_1\alpha_2}_{\text{skew}}\right) + \underbrace{\alpha_3}_{\text{trapezoid in }x}\left(h_y\eta - \underbrace{\alpha_2}_{\text{skew in }y}\xi\right) + \underbrace{\alpha_4}_{\text{trapezoid in }y}\left(h_x\xi - \underbrace{\alpha_1}_{\text{skew in }x}\eta\right)$$

1.25 $$\mathbf{J}^{-1}(\xi,\eta) = \begin{bmatrix}j^{-11} & j^{-12}\\ j^{-21} & j^{-22}\end{bmatrix} = \frac{1}{J(\xi,\eta)}\left(\begin{bmatrix}h_y & 0\\ 0 & h_x\end{bmatrix} + \begin{bmatrix}0 & -\alpha_2\\ -\alpha_1 & 0\end{bmatrix} + \begin{bmatrix}\alpha_4\xi & -\alpha_4\eta\\ -\alpha_3\xi & \alpha_3\eta\end{bmatrix}\right)$$

Fig. 15

1.26
$$\frac{\partial}{\partial x} = j^{-11}\frac{\partial}{\partial \xi} + j^{-12}\frac{\partial}{\partial \eta}$$
$$\frac{\partial}{\partial y} = j^{-21}\frac{\partial}{\partial \xi} + j^{-22}\frac{\partial}{\partial \eta}$$

1.27
$$\frac{1}{J_0 + J_1\xi + J_2\eta} = \frac{1}{J_0} - \frac{J_1}{J_0^2}\xi - \frac{J_2}{J_0^2}\eta + \frac{J_1^2}{J_0^3}\xi^2 + 2\frac{J_1 J_2}{J_0^3}\xi\eta + \frac{J_2^2}{J_0^3}\eta^2 + \ldots$$

1.28
$$\mathbf{J}^{-1}(\xi,\eta) \approx \frac{J_0 - J_1\xi - J_2\eta}{J_0^2}\left(\begin{bmatrix} h_y & -\alpha_2 \\ -\alpha_1 & h_x \end{bmatrix} + \begin{bmatrix} \alpha_4\xi & -\alpha_4\eta \\ -\alpha_3\xi & \alpha_3\eta \end{bmatrix}\right)$$

1.29
$$\mathbf{J}^{-1}(\xi,\eta) \approx \frac{J_0 - J_1\xi - J_2\eta}{J_0^2}\begin{bmatrix} h_y & -\alpha_2 \\ -\alpha_1 & h_x \end{bmatrix} + \frac{1}{J_0}\begin{bmatrix} \alpha_4\xi & -\alpha_4\eta \\ -\alpha_3\xi & \alpha_3\eta \end{bmatrix}$$

Fig. 16

1.30
$$u_x(\xi,\eta) = \sum_{i=1}^{4} N_i(\xi,\eta) u_{xi} = u_0^x + u_1^x \xi + u_2^x \eta + u_3^x \xi\eta$$

$$u_y(\xi,\eta) = \sum_{i=1}^{4} N_i(\xi,\eta) u_{yi} = u_0^y + u_1^y \xi + u_2^y \eta + u_3^y \xi\eta$$

1.31
$$u_0^x = \frac{1}{4}\mathbf{h}_0^T \mathbf{u} = \frac{1}{4}\sum_{i=1}^{4} u_{xi} \qquad u_0^y = \frac{1}{4}\mathbf{h}_0^T \mathbf{v} = \frac{1}{4}\sum_{i=1}^{4} u_{yi}$$

$$u_1^x = \frac{1}{4}\mathbf{h}_1^T \mathbf{u} = \frac{1}{4}\sum_{i=1}^{4} \xi_i u_{xi} \qquad u_1^y = \frac{1}{4}\mathbf{h}_1^T \mathbf{v} = \frac{1}{4}\sum_{i=1}^{4} \xi_i u_{yi}$$

$$u_2^x = \frac{1}{4}\mathbf{h}_2^T \mathbf{u} = \frac{1}{4}\sum_{i=1}^{4} \eta_i u_{xi} \qquad u_2^y = \frac{1}{4}\mathbf{h}_2^T \mathbf{v} = \frac{1}{4}\sum_{i=1}^{4} \eta_i u_{yi}$$

$$u_3^x = \frac{1}{4}\mathbf{h}_3^T \mathbf{u} = \frac{1}{4}\sum_{i=1}^{4} \xi_i \eta_i u_{xi} \qquad u_3^y = \frac{1}{4}\mathbf{h}_3^T \mathbf{v} = \frac{1}{4}\sum_{i=1}^{4} \xi_i \eta_i u_{yi}$$

1.32
$$\mathbf{u} = \begin{Bmatrix} u_{x1} \\ u_{x2} \\ u_{x3} \\ u_{x4} \end{Bmatrix}, \quad \mathbf{v} = \begin{Bmatrix} u_{y1} \\ u_{y2} \\ u_{y3} \\ u_{y4} \end{Bmatrix}$$

Fig. 17

1.33
$$\frac{\partial u_x}{\partial \xi} = \sum_{i=1}^{4} \frac{\partial N_i}{\partial \xi} u_{xi} = \underbrace{u_1^x}_{\text{stretch in } x} + \underbrace{u_3^x}_{\text{bend in } x} \eta$$

$$\frac{\partial u_x}{\partial \eta} = \sum_{i=1}^{4} \frac{\partial N_i}{\partial \eta} u_{xi} = \underbrace{u_2^x}_{\text{shear in } x} + \underbrace{u_3^x}_{\text{bend in } x} \xi$$

$$\frac{\partial u_y}{\partial \xi} = \sum_{i=1}^{4} \frac{\partial N_i}{\partial \xi} u_{yi} = \underbrace{u_1^y}_{\text{shear in } y} + \underbrace{u_3^y}_{\text{bend in } y} \eta$$

$$\frac{\partial u_y}{\partial \eta} = \sum_{i=1}^{4} \frac{\partial N_i}{\partial \eta} u_{yi} = \underbrace{u_2^y}_{\text{stretch in } y} + \underbrace{u_3^y}_{\text{bend in } y} \xi$$

1.34
$$\varepsilon_x = \frac{\partial u_x}{\partial x} = j^{-11} \frac{\partial u_x}{\partial \xi} + j^{-12} \frac{\partial u_x}{\partial \eta}$$

$$\varepsilon_y = \frac{\partial u_y}{\partial y} = j^{-21} \frac{\partial u_y}{\partial \xi} + j^{-22} \frac{\partial u_y}{\partial \eta}$$

$$\gamma_{xy} = \frac{\partial u_x}{\partial y} + \frac{\partial u_y}{\partial x} = j^{-21} \frac{\partial u_x}{\partial \xi} + j^{-22} \frac{\partial u_x}{\partial \eta} + j^{-11} \frac{\partial u_y}{\partial \xi} + j^{-12} \frac{\partial u_y}{\partial \eta}$$

1.35
$$\varepsilon_x = \frac{1}{J(\xi,\eta)} \left\{ \left( h_y u_1^x - \alpha_2 u_2^x \right) + \left( -\alpha_2 u_3^x + \alpha_4 u_1^x \right) \xi + \left( h_y u_3^x - \alpha_4 u_2^x \right) \eta \right\}$$

$$\varepsilon_y = \frac{1}{J(\xi,\eta)} \left\{ \left( h_x u_2^y - \alpha_1 u_1^y \right) + \left( h_x u_3^y - \alpha_3 u_1^y \right) \xi + \left( -\alpha_1 u_3^y + \alpha_3 u_2^y \right) \eta \right\}$$

$$\gamma_{xy} = \frac{1}{J(\xi,\eta)} \begin{Bmatrix} h_x u_2^x - \alpha_1 u_1^x + h_y u_1^y - \alpha_2 u_2^y \\ + \left( h_x u_3^x - \alpha_3 u_1^x - \alpha_2 u_3^y + \alpha_4 u_1^y \right) \xi \\ + \left( h_y u_3^y - \alpha_4 u_2^y - \alpha_1 u_3^x + \alpha_3 u_2^x \right) \eta \end{Bmatrix}$$

Fig. 19

1.36
$$\varepsilon_e = \frac{1}{J(\xi,\eta)} \begin{Bmatrix} -y^T G u \\ x^T G v \\ x^T G u - y^T G v \end{Bmatrix}$$

1.37
$$G = \left(h_1 h_2^T - h_2 h_1^T\right) + \left(h_1 h_3^T - h_3 h_1^T\right)\xi + \left(h_3 h_2^T - h_2 h_3^T\right)\eta$$
$$= G_0 + G_1 \xi + G_2 \eta$$

Fig. 20

1.38
$$\varepsilon_x = \frac{1}{J(\xi,\eta)} \left\{ \begin{array}{l} h_y \left( \underbrace{u_1^x}_{\text{stretch in } x} + \underbrace{u_3^x}_{\text{bend in } x} \eta \right) \\ - \underbrace{\alpha_2}_{\text{skew in } y} \left( \underbrace{u_2^x}_{\text{shear in } x} + \underbrace{u_3^x}_{\text{bend in } x} \xi \right) \\ + \underbrace{\alpha_4}_{\text{trapezoid in } y} \left( \underbrace{u_1^x}_{\text{stretch in } x} \xi - \underbrace{u_2^x}_{\text{shear in } x} \eta \right) \end{array} \right\}$$

1.39
$$\varepsilon_y = \frac{1}{J(\xi,\eta)} \left\{ \begin{array}{l} h_x \left( \underbrace{u_2^y}_{\text{stretch in } y} + \underbrace{u_3^y}_{\text{bend in } y} \xi \right) \\ - \underbrace{\alpha_1}_{\text{skew in } x} \left( \underbrace{u_1^y}_{\text{shear in } y} + \underbrace{u_3^y}_{\text{bend in } y} \eta \right) \\ + \underbrace{\alpha_3}_{\text{trapezoid in } x} \left( \underbrace{u_2^y}_{\text{stretch in } y} \eta - \underbrace{u_1^y}_{\text{shear in } y} \xi \right) \end{array} \right\}$$

1.40
$$\gamma_{xy} = \frac{1}{J(\xi,\eta)} \left[ \begin{array}{l} \left\{ h_x \left( \underbrace{u_2^x}_{\text{shear in } x} + \underbrace{u_3^x}_{\text{bend in } x} \xi \right) + h_y \left( \underbrace{u_1^y}_{\text{shear in } y} + \underbrace{u_3^y}_{\text{bend in } y} \eta \right) \right\} \\ - \left\{ \underbrace{\alpha_1}_{\text{skew in } x} \left( \underbrace{u_1^x}_{\text{stretch in } x} + \underbrace{u_3^x}_{\text{bend in } x} \eta \right) + \underbrace{\alpha_2}_{\text{skew in } y} \left( \underbrace{u_2^y}_{\text{stretch in } y} + \underbrace{u_3^y}_{\text{bend in } y} \xi \right) \right\} \\ - \left\{ \underbrace{\alpha_3}_{\text{trapezoid in } x} \left( \underbrace{u_1^x}_{\text{stretch in } x} \xi - \underbrace{u_2^x}_{\text{shear in } x} \eta \right) + \underbrace{\alpha_4}_{\text{trapezoid in } y} \left( \underbrace{u_2^y}_{\text{stretch in } y} \eta - \underbrace{u_1^y}_{\text{shear in } y} \xi \right) \right\} \end{array} \right]$$

$$\varepsilon_x = \frac{1}{h_x}\left(u_1^x + u_3^x \eta\right)$$

$$\varepsilon_y = \frac{1}{h_y}\left(u_2^y + u_3^y \xi\right)$$

$$\gamma_{xy} = \left(\frac{u_1^y}{h_x} + \frac{u_2^x}{h_y}\right) + \frac{u_3^x}{h_y}\xi + \frac{u_3^y}{h_x}\eta$$

Fig. 22

2.1
$$u_x(x,y,z) = \sum_{i=0}^{\infty} u_x^{(i)}(x,y,0)\phi_i(z)$$

2.2
$$u_x^{(i)}(x,y,0) = \frac{\partial^i u_t}{\partial z^i}(x,y,0)$$
$$\phi_i(z) = z^i$$

2.3
$$u_x(x,y,z) = u_x(x,y,0) + zu_x^{(1)}(x,y,0) + z^2 u_x^{(2)}(x,y,0) + \cdots$$
$$u_y(x,y,z) = u_y(x,y,0) + zu_y^{(1)}(x,y,0) + z^2 u_y^{(2)}(x,y,0) + \cdots$$
$$u_z(x,y,z) = u_z(x,y,0) + zu_z^{(1)}(x,y,0) + z^2 u_z^{(2)}(x,y,0) + \cdots$$

2.4
$$u_x(x,y,z) \approx u_x(x,y,0) + zu_x^{(1)}(x,y,0) = u + z\theta_y$$
$$u_y(x,y,z) \approx u_y(x,y,0) + zu_y^{(1)}(x,y,0) = v - z\theta_x$$
$$u_z(x,y,z) \approx u_z(x,y,0) = w$$

Fig. 23

2.5
$$\varepsilon_x = \frac{\partial u_x}{\partial x} = \frac{\partial u}{\partial x} + z\frac{\partial \theta_y}{\partial x}$$
$$\varepsilon_y = \frac{\partial u_y}{\partial y} = \frac{\partial v}{\partial y} - z\frac{\partial \theta_x}{\partial y}$$
$$\varepsilon_z = \frac{\partial u_z}{\partial z} = \frac{\partial w}{\partial z} = 0$$
$$\gamma_{yz} = \frac{\partial u_z}{\partial y} + \frac{\partial u_y}{\partial z} = \frac{\partial w}{\partial y} - \theta_x$$
$$\gamma_{zx} = \frac{\partial u_z}{\partial x} + \frac{\partial u_x}{\partial z} = \frac{\partial w}{\partial x} + \theta_y$$
$$\gamma_{xy} = \frac{\partial u_x}{\partial y} + \frac{\partial u_y}{\partial x} = \frac{\partial u}{\partial y} + \frac{\partial v}{\partial x} + z\left(\frac{\partial \theta_y}{\partial y} - \frac{\partial \theta_x}{\partial x}\right)$$

2.6
$$\varepsilon = \begin{Bmatrix} \varepsilon_x \\ \varepsilon_y \\ \varepsilon_z \\ \gamma_{yz} \\ \gamma_{zx} \\ \gamma_{xy} \end{Bmatrix} = \begin{bmatrix} \frac{\partial}{\partial x} & 0 & 0 \\ 0 & \frac{\partial}{\partial y} & 0 \\ 0 & 0 & \frac{\partial}{\partial z} \\ 0 & \frac{\partial}{\partial z} & \frac{\partial}{\partial y} \\ \frac{\partial}{\partial z} & 0 & \frac{\partial}{\partial x} \\ \frac{\partial}{\partial y} & \frac{\partial}{\partial x} & 0 \end{bmatrix} \begin{Bmatrix} u_x \\ u_y \\ u_z \end{Bmatrix} = \begin{bmatrix} \frac{\partial}{\partial x} & 0 & 0 & 0 & z\frac{\partial}{\partial x} \\ 0 & \frac{\partial}{\partial y} & 0 & -z\frac{\partial}{\partial y} & 0 \\ 0 & 0 & 0 & 0 & 0 \\ 0 & 0 & \frac{\partial}{\partial y} & -1 & 0 \\ 0 & 0 & \frac{\partial}{\partial x} & 0 & 1 \\ \frac{\partial}{\partial y} & \frac{\partial}{\partial x} & 0 & -z\frac{\partial}{\partial x} & z\frac{\partial}{\partial y} \end{bmatrix} \begin{Bmatrix} u \\ v \\ w \\ \theta_x \\ \theta_y \end{Bmatrix}$$

Fig. 25

2.7
$$\sigma = \begin{Bmatrix} \sigma_x \\ \sigma_y \\ \sigma_z \\ \tau_{yz} \\ \tau_{zx} \\ \tau_{xy} \end{Bmatrix} = \frac{E}{1-\nu^2} \begin{bmatrix} 1 & \nu & 0 & & & \\ \nu & 1 & 0 & & 0 & \\ 0 & 0 & 1-\nu^2 & & & \\ & & & \kappa_y \frac{1-\nu}{2} & 0 & 0 \\ & 0 & & 0 & \kappa_x \frac{1-\nu}{2} & 0 \\ & & & 0 & 0 & \frac{1-\nu}{2} \end{bmatrix} \begin{Bmatrix} \varepsilon_x \\ \varepsilon_y \\ \varepsilon_z \\ \gamma_{yz} \\ \gamma_{zx} \\ \gamma_{xy} \end{Bmatrix} = \mathbf{D}\varepsilon$$

2.8
$$\mathbf{u} = \begin{Bmatrix} u_x \\ u_y \\ u_z \end{Bmatrix} = \underbrace{\begin{Bmatrix} u \\ v \\ 0 \end{Bmatrix}}_{\text{membrane}} + \underbrace{\begin{Bmatrix} z\theta_y \\ -z\theta_x \\ w \end{Bmatrix}}_{\text{plate bending}}$$

2.9
$$\varepsilon_p = \begin{Bmatrix} \varepsilon_x \\ \varepsilon_y \\ \gamma_{xy} \end{Bmatrix} = \underbrace{\begin{bmatrix} \frac{\partial}{\partial x} & 0 \\ 0 & \frac{\partial}{\partial y} \\ \frac{\partial}{\partial y} & \frac{\partial}{\partial x} \end{bmatrix}}_{\text{membrane}} \begin{Bmatrix} u \\ v \end{Bmatrix} + z \underbrace{\begin{bmatrix} 0 & 0 & \frac{\partial}{\partial x} \\ 0 & -\frac{\partial}{\partial y} & 0 \\ 0 & -\frac{\partial}{\partial x} & \frac{\partial}{\partial y} \end{bmatrix}}_{\text{plate bending}} \begin{Bmatrix} w \\ \theta_x \\ \theta_y \end{Bmatrix} = \partial_m \mathbf{u}_m + z\partial_p \mathbf{w}$$

Fig. 26

2.10 $$\gamma_s = \begin{Bmatrix} \gamma_{yz} \\ \gamma_{zx} \end{Bmatrix} = \begin{bmatrix} \dfrac{\partial}{\partial y} & -1 & 0 \\ \dfrac{\partial}{\partial x} & 0 & 1 \end{bmatrix} \begin{Bmatrix} w \\ \theta_x \\ \theta_y \end{Bmatrix} = \partial_s \mathbf{w}$$

2.11 $$U = \frac{1}{2} \int_\Omega \varepsilon^T \sigma \, d\Omega$$
$$= \frac{1}{2} \int_\Omega \left( \varepsilon_p^T \mathbf{D}_p \varepsilon_p + \gamma_s \mathbf{D}_s \gamma_s \right) d\Omega$$

2.12 $$\mathbf{D}_p = \frac{E}{1-\nu^2} \begin{bmatrix} 1 & \nu & 0 \\ \nu & 1 & 0 \\ 0 & 0 & (1-\nu)/2 \end{bmatrix}, \quad \mathbf{D}_s = \frac{E}{2(1+\nu)} \begin{bmatrix} \kappa_y & 0 \\ 0 & \kappa_x \end{bmatrix}$$

2.13 $$U = \frac{1}{2} \int_{-h/2}^{+h/2} \int_A (z \partial_p \mathbf{w})^T \mathbf{D}_p (z \partial_p \mathbf{w}) \, dA \, dz + \int_{-h/2}^{+h/2} \int_A (\partial_s \mathbf{w})^T \mathbf{D}_s (\partial_s \mathbf{w}) \, dA \, dz$$
$$= \frac{1}{2} \frac{h^3}{12} \left[ \int_A (\partial_p \mathbf{w})^T \mathbf{D}_p (\partial_p \mathbf{w}) \, dA + \frac{12}{h^2} \int_A (\partial_s \mathbf{w})^T \mathbf{D}_s (\partial_s \mathbf{w}) \, dA \right]$$

Fig. 27

3.1 $$E_e = \frac{U_e(\mathbf{u}) - U_e(\mathbf{u}_h)}{U_e(\mathbf{u})}$$

3.2 $$\boldsymbol{\sigma} = \begin{Bmatrix} \sigma_x \\ \sigma_y \\ \tau_{xy} \end{Bmatrix} = \begin{Bmatrix} -(M/I)y \\ 0 \\ 0 \end{Bmatrix}$$

3.3 $$\boldsymbol{\varepsilon} = \mathbf{D}^{-1}\boldsymbol{\sigma} = \frac{1}{E}\begin{bmatrix} 1 & -\nu & 0 \\ -\nu & 1 & 0 \\ 0 & 0 & 2(1+\nu) \end{bmatrix}\begin{Bmatrix} \sigma_x \\ \sigma_y \\ \tau_{xy} \end{Bmatrix} = \frac{M}{EI}\begin{Bmatrix} -y \\ \nu y \\ 0 \end{Bmatrix}$$

3.4 $$U_e = \frac{1}{2}\int_{\Omega_e} \boldsymbol{\varepsilon}^T \mathbf{D}\boldsymbol{\varepsilon}\, d\Omega$$

Fig. 29

3.5
$$u_x = -\frac{M}{EI}xy$$
$$u_y = \frac{1}{2}\frac{M}{EI}(x^2 + vy^2)$$

3.6
$$u_1^x = \frac{1}{4}\mathbf{h}_1^T\mathbf{u} = -\frac{M}{EI}\frac{b}{2}h_y$$
$$u_1^y = \frac{1}{4}\mathbf{h}_1^T\mathbf{v} = \frac{M}{EI}\left(\frac{b}{2}\right)^2$$
$$u_2^x = \frac{1}{4}\mathbf{h}_2^T\mathbf{u} = 0$$
$$u_2^y = \frac{1}{4}\mathbf{h}_2^T\mathbf{v} = \frac{M}{EI}\frac{b}{2}h_x$$

bending in $x$ $$u_3^x = \frac{1}{4}\mathbf{h}_3^T\mathbf{u} = \boxed{-\frac{M}{EI}h_x h_y}$$
$$u_3^y = \frac{1}{4}\mathbf{h}_3^T\mathbf{v} = -\frac{M}{EI}\frac{b}{2}h_x$$

3.7
$$U_e^h = \frac{1}{2}\mathbf{d}^T\mathbf{K}_e\mathbf{d}$$

Fig. 30

3.8
$$U_e(\mathbf{v}) = \frac{1}{2} \int_{\Omega_e} \varepsilon(\mathbf{v})^T \mathbf{D}\varepsilon(\mathbf{v}) d\Omega$$

Fig. 31

| Displacement | Pure bending | Torsion | 1-point loading |
|---|---|---|---|
| $w(x,y)$ | $w = \dfrac{M_y}{2EI_y}(x^2 - vy^2)$ | $w = \phi xy$ | $w = \sum_{i,j=1}^{\infty} w_{ij}\phi_{ij}(x,y)$ |
| $\theta_x(x,y)$ | $\theta_x = -\dfrac{vM_y}{EI_y}y$ | $\theta_x = \phi x$ | $\theta_x = \sum_{i,j=1}^{\infty} w_{ij}\dfrac{\partial \phi_{ij}}{\partial y}$ |
| $\theta_y(x,y)$ | $\theta_y = -\dfrac{M_y}{EI_y}x$ | $\theta_y = 0$ | $\theta_y = -\sum_{i,j=1}^{\infty} w_{ij}\dfrac{\partial \phi_{ij}}{\partial x}$ |

Fig. 32

3.9 $$\phi_{ij}(x,y) = \left[\left(x-\frac{a}{2}\right)\left(x+\frac{a}{2}\right)+\left(y-\frac{b}{2}\right)\left(y+\frac{b}{2}\right)\right]x^{2(I-1)}y^{2(J-1)}$$

3.10 $$U_e(\mathbf{u}_h) = \frac{1}{2}\mathbf{d}^T\mathbf{K}_e\mathbf{d}$$

Fig. 33

3.11
$$\gamma_{zx} = \kappa_x \left( \frac{\partial w}{\partial x} + \theta_y \right)$$
$$\gamma_{zy} = \kappa_y \left( \frac{\partial w}{\partial y} - \theta_x \right)$$

Fig. 36

| Element Number | Propriety | Total Analysis Error (%) | Individual Analysis Error (%) | | | |
|---|---|---|---|---|---|---|
| | | | Aspect Ratio | Warping Amount | Skew Amount | Trapezoid Amount |
| 1 | ○ | 1 | 1 | 0 | 1 | 2 |
| 2 | ○ | 3 | 0 | 2 | 0 | 1 |
| 3 | × | 10 | 5 | 1 | 0 | 2 |
| 4 | ○ | 2 | 0 | 1 | 1 | 0 |
| 5 | ○ | 4 | 1 | 0 | 0 | 3 |

Fig.42

| Displacement | Tension $\sigma_x = F/A$ | Pure bending $\sigma_x = -M_z y/I$ | Pure shear $\tau_{xy} = P/A_x$ |
|---|---|---|---|
| $u(x,y)$ | $u = \dfrac{F}{EA}x$ | $u = -\dfrac{M_z}{EI_z}xy$ | $u = \dfrac{P}{2GA_x}y$ |
| $v(x,y)$ | $v = -\dfrac{\nu F}{EA}y$ | $v = \dfrac{M_z}{2EI_z}x^2 + \dfrac{\nu M_z}{2EI_z}y^2$ | $v = \dfrac{P}{2GA_x}x$ |

Fig. 44

PROCESS OF ESTIMATING RELATIONSHIP BETWEEN ELEMENT DISTORTION AND ANALYSIS ERROR

TECHNICAL FIELD

The present invention relates to techniques of estimating an analysis error due to distortion of an element which is used for approximately representing the shape of an object and for analyzing the deformation of the object by a finite element method, wherein the analysis error occurs in analysis results of the object by the finite element method.

BACKGROUND ART

A finite element method is known as an approach to analyze the deformation of an object. In the finite element method, an object is approximated for representation into a set of a plurality of elements, and the deformation of the object is analyzed by use of the set of plurality of elements. More specifically, according to one known example of the finite element method, the shape of an object to be analyzed is approximately represented by means of elements, and then the deformation of the object is analyzed with the use of the elements. Each of the elements (plane elements or plane-like elements) may be defined to be a membrane element, a shell element having a thin wall, an element having a quadrilateral plane, an element having a triangular plane, etc.

Approximation accuracy of the finite element method depends on the type of a selected technique to partition an object into a plurality of elements, as hereinafter referred to as "element generation" or "mesh generation." Therefore, in order to reduce errors in results of analysis by the finite element method (hereinafter, referred to as "analysis error"), an object to be analyzed is partitioned into a plurality of elements, such that the size or the shape of each element is proper with respect to the position of each element within the object, for example, such as disclosed in JP Hei 04-268674 and JP Hei 11-25292.

JP Hei 04-268674 discloses techniques of, once an analyzed object, i.e., a structure has been partitioned into a finite number of meshes (elements), optimizing the mesh generation, by moving nodes which have been initially assigned to the analyzed object, in consideration of the resulting errors in analysis results of such as stress, strain energy, etc. This technique provides one example of modification of elements in shape.

JP Hei 11-25292 discloses techniques of generating meshes of an analyzed object, each of which has the size meeting analysis accuracy required, and techniques of selecting the type of mesh generation as one of uniform mesh generation, non-uniform mesh generation, and junction mesh generation, depending upon the location of each mesh within the analyzed object. This technique provides another example of modification of elements in shape.

One example of a conventional mesh generation technique exists that allows the surface of an object to be partitioned into a plurality of meshes or elements so that every mesh or element may be desirable in shape. The conventional technique enables mesh generation to be performed so that every one of a plurality of elements (quadrilateral elements) into which the surface of an object is partitioned may be formed to be as close as possible to a square, i.e., a quadrilateral not distorted.

Further, in the above conventional technique, for evaluation to determine whether the shape of each element generated by mesh generation is desirable or not, the geometric distortion of the shape of each element due to the mesh generation is expressed by means of four geometric characteristic quantities, namely, the aspect ratio; the amount of warping; the amount of skew; and the amount of trapezoid, of each element.

The aspect ratio is defined, for example, as the ratio between a first and a second distance. The first distance is measured between a reference point of a distorted element, which is generally located at the center of the distorted element, and the midpoint of a first one of four sides of the distorted element (hereinafter, referred to as "element-sides"). The second distance is measured between the reference point, and the midpoint of a second one of the four element-sides, which is a selected one of two element-sides consecutive to the first element-side.

The amount of warping is defined, for example, with the use of a projection plane which is assumed for a distorted element such that the projection plane is equidistant from four nodes of the distorted element. More specifically, the amount of warping is defined as the arc sine of the ratio of a projection height equal to the distance between the projection plane and each node of the distorted element, to the half of the length of a selected one of the four element-sides of the distorted element.

The amount of skew is defined, for example, as the difference 90 degrees minus a smaller one of angles between a first and a second line. The first line passes through both the aforementioned reference point and the midpoint of the aforementioned first element-side. The second line passes through both the reference point and the midpoint of the aforementioned second element-side.

The mount of trapezoid is defined, for example, using a triangle for each element-side of a distorted element. The triangle is formed by a combination of the present element-side, and two rectilinear segments connecting the aforementioned reference point and each of the two nodes of the present element-side. In the example, the amount of trapezoid is then defined as four times the smallest one of four areas of four triangles which have resultantly generated for the four element-sides, respectively, divided by the total of the four areas.

Then, according to the above-described conventional technique, the actual value of each of the aforementioned four geometric characteristic quantities is compared with an allowable value, per each element. If the actual value of at least one of the four geometric characteristic quantities, for an element, exceeds the allowable value, then it is determined that the element is not proper in shape.

DISCLOSURE OF THE INVENTION

However, in the above-described conventional technique, the relationship between the geometric characteristic quantities and analysis errors occurring due to the geometric characteristic quantities in analysis results fails to be made clear. As a result, in order to make a determination of whether or not the shape of each element is proper in reference to the actual value of the aforementioned geometric characteristic quantities, a mere reliance on experience is allowed.

For the above reason, the conventional technique may possibly arise a false determination that an element whose shape actually contributes to a reduction in analysis error is nevertheless improper in shape, resulting in wasted time on unnecessary modification of elements.

Furthermore, the conventional technique also may possibly arise another false determination that an element whose shape actually increases an analysis error is nevertheless proper in shape, resulting in a researcher's wrong reliance on analysis results provided not through required modification of elements.

A study of the present inventors about the relationship between the geometric characteristic quantities and the analysis error has revealed that, if a deformation mode occurring in each element of an analyzed object during deformation thereof is determined or identified, the relationship between the geometric characteristic quantities and the analysis error can be derived in a mathematical manner.

It is therefore an object of the present invention to quantitatively estimate, based on the above-described findings, an analysis error due to geometric distortion of each element of a to-be analyzed object, occurring in analysis results of the analyzed object.

The present invention provides a process of estimating by a computer an element-distortion-to-analysis-error relationship between geometric distortion of an element which is used for approximately representing a shape of an object and for analyzing deformation of the object by the finite element method, and an analysis error which occurs due to the geometric distortion of the element in analysis results of the object by the finite element method.

More specifically, the present invention provides a process comprising: assuming at least one deformation mode occurring in the element upon deformation of the object, in the form of at least one of tension, bending, shear, and torsion; and estimating the analysis error associated with the geometric distortion, for each of the at least one assumed deformation mode.

BRIEF DESCRIPTION OF THE DRAWINGS

The foregoing disclosure, as well as the following detailed description of best mode for carrying out the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1 shows Equations 1.1 through 1.3 for explaining the theoretical background of principle of estimation applied to estimate an analysis error due to element distortion in a numerical analysis method according to one embodiment of the present invention;

FIG. 2 shows Equations 1.4 through 1.6 for explaining the aforementioned theoretical background of principle of estimation;

FIG. 4 shows Equations 1.7 through 1.10 for explaining the aforementioned theoretical background of principle of estimation;

FIG. 5 shows Equations 1.11 through 1.14 for explaining the aforementioned theoretical background of principle of estimation;

FIG. 7 shows Equations 1.15 and 1.18 for explaining the aforementioned theoretical background of principle of estimation;

FIG. 8 shows Equation 1.19 for explaining the aforementioned theoretical background of principle of estimation;

FIG. 9 is a table illustrating an example of the global coordinates of nodes of an arbitrary quadrilateral element, the origin of the local coordinate system, and axis vectors, for explaining the aforementioned theoretical background of principle of estimation;

FIG. 10 is a table illustrating an example of the local coordinate of nodes of an arbitrary quadrilateral element for explaining the aforementioned theoretical background of principle of estimation;

FIG. 13 shows Equations 1.20 and 1.21 for explaining the aforementioned theoretical background of principle of estimation;

FIG. 15 shows Equations 1.22 through 1.25 for explaining the aforementioned theoretical background of principle of estimation;

FIG. 16 shows Equations 1.26 through 1.29 for explaining the aforementioned theoretical background of principle of estimation;

FIG. 17 shows Equations 1.30 through 1.32 for explaining the aforementioned theoretical background of principle of estimation;

FIG. 19 shows Equations 1.33 through 1.35 for explaining the aforementioned theoretical background of principle of estimation;

FIG. 20 shows Equations 1.36 through 1.37 for explaining the aforementioned theoretical background of principle of estimation;

FIG. 21 shows Equations 1.38 through 1.40 for explaining the aforementioned theoretical background of principle of estimation;

FIG. 22 shows Equation 1.41 for explaining the aforementioned theoretical background of principle of estimation;

FIG. 23 shows Equations 2.1 through 2.4 for explaining the aforementioned theoretical background of principle of estimation;

FIG. 25 shows Equations 2.5 and 2.6 for explaining the aforementioned theoretical background of principle of estimation;

FIG. 26 shows Equations 2.7 through 2.9 for explaining the aforementioned theoretical background of principle of estimation;

FIG. 27 shows Equations 2.10 through 2.13 for explaining the aforementioned theoretical background of principle of estimation;

FIG. 29 shows Equations 3.1 through 3.4 for explaining the aforementioned theoretical background of principle of estimation;

FIG. 30 shows Equations 3.5 through 3.7 for explaining the aforementioned theoretical background of principle of estimation;

FIG. 31 shows Equation 3.8 for explaining the aforementioned theoretical background of principle of estimation;

FIG. 32 is a table presenting an example of a plurality of analytical deformation functions for explaining the aforementioned theoretical background of principle of estimation;

FIG. 33 shows Equations 3.9 through 3.10 for explaining the aforementioned theoretical background of principle of estimation;

FIG. 36 shows Equation 3.11 for explaining the aforementioned theoretical background of principle of estimation;

FIG. 42 illustrates an example of presentation provided by the execution of steps S112 and S114 in FIG. 41;

FIG. 44 is a table presenting an example of a plurality of analytical deformation functions for explaining the aforementioned theoretical background of principle of estimation.

BEST MODE FOR CARRYING OUT THE INVENTION

Figure 3:
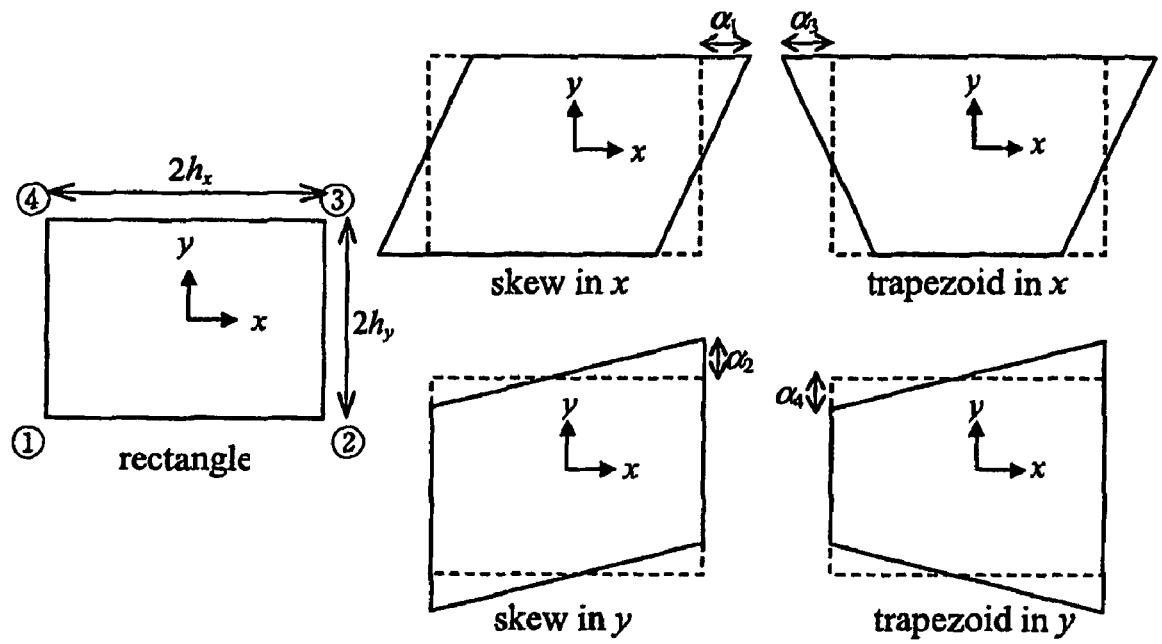
FIG. 3 illustrates the kinds of distortions of a quadrilateral element in the above principle of estimation.

The object mentioned above may be achieved according to any one of the following modes of the invention.

These modes will be stated below such that these modes are sectioned and numbered, and such that these modes depend upon the other mode or modes, where appropriate. This is for a better understanding of some of a plurality of technological features and a plurality of combinations thereof disclosed in this description, and does not mean that the scope of these features and combinations is interpreted to be limited to the scope of the following modes of the invention.

That is to say, it should be interpreted that it is allowable to select the technological features which are stated in this description but which are not stated in the following modes, as the technological features of the invention.

Furthermore, stating each one of the selected modes of the invention in such a dependent form as to depend from the other mode or modes does not exclude a possibility of the technological features in a dependent-form mode to become independent of those in the corresponding depended mode or modes and to be removed therefrom. It should be interpreted that the technological features in a dependent-form mode is allowed to become independent according to the nature of the corresponding technological features, where appropriate.

(1) A process of estimating by a computer an element-distortion-to-analysis-error relationship between geometric distortion of an element which is used for approximately representing a shape of an object and for analyzing deformation of the object by a finite element method, and an analysis error which occurs, due to the geometric distortion of the element, in analysis results of the object by the finite element method, the process comprising:

an assuming step of assuming at least one deformation mode occurring in the element upon deformation of the object, in the form of at least one of tension, bending, shear, and torsion; and an estimating step of estimating the analysis error associated with the geometric distortion, for each of the at least one assumed deformation mode.

The present inventors have acquired the findings that the geometric distortion of an arbitrary element can be completely defined by focusing on a plurality of geometric properties, and that the plurality of geometric properties are independent of each other, the theoretical background of which will be described in greater detail later. The findings allow the distortion of an element to be precisely represented.

Assuming an arbitrary virtual displacement from an equilibrium condition, work done by an external force, i.e., the product of the virtual displacement and the external force equals an increase in strain energy. This is referred to as "Principle of Virtual Displacement." For linear elasticity, the principle of virtual displacement becomes equivalent to the principle of minimum total potential energy. Expressing the principle in view of energy, the principle of minimum total potential energy that the true solution of displacement minimizes a displacement function as called "potential energy" is provided. According to the principle, the potential energy "I" decreases to the minimum in the event of the true displacement "u." The potential energy "I" contains strain energy "U" and potential energy of an external force, both stored in an element. The principle of minimum total potential energy forms the theoretical fundamentals of the finite element method.

Thus, the strain energy and the displacement have a dependency therebetween, and as a result, an error occurring in a calculation of the strain energy involves an error occurring in a calculation of the displacement, namely, the analysis results of the displacement.

As the amount of distortion of an element is increased, strain energy stored in the element is also increased, the theoretical background of which will be described in greater detail later. In addition, if a deformation mode of an element is provided, an analytical solution of strain energy of the element can be calculated, not using a finite element analysis, but using theoretical solutions of stress and strain of the element. Further, if a deformation mode of an element is provided, an approximated solution of strain energy of the element can be calculated based on a finite element approximation using an theoretical solution of the nodal displacement of the element. The difference between the analytical and the approximated solution refers to an error in the strain energy. As is easily understood from the above, this error leads to an error in the analysis results by the finite element method.

Based on the findings described above, in the process according to mode (1), a deformation mode occurring in an element during deformation of an object is assumed in the form of at least one of tension, bending, shear, and torsion. Further, an analysis error is estimated in association with the distortion of the element, for each of the at least one assumed deformation mode.

In the context, the "distortion" of the element refers to deviation of the real shape of the element from a reference shape (e.g., a reference square).

(2) The process according to mode (1), wherein the element is formed as a plane-like element having a plane thereof, and wherein the estimating step comprises a first calculating step of:

(a) coordinate-transforming the plane-like element into an isoparametric element and expressing skew and trapezoid of the plane-like element with a plurality of basic distortion parameters which are defined so as to deal with the skew and the trapezoid independently of each other, wherein the skew and the trapezoid are the geometric distortion of the plane-like element;

(b) decomposing the deformation mode of the plane-like element into a plurality of basic deformation modes including tension, shear, and bending, by dealing with the plane-like element as the isoparametric element;

(c) calculating strain energy of the plane-like element by formulating normal strains and shear strain of the plane-like element, with the plurality of basic distortion parameters and the plurality of basic deformation modes, by dealing with the plane-like element as the isoparametric element; and (d) calculating the analysis error associated with a value of each of the plurality of basic distortion parameters, for each of the plurality of basic deformation modes, based on the calculated strain energy of the plane-like element.

In the above context, the "plane-like element" may be interpreted to mean such as a plane element in the narrow sense, a plate element, a membrane element, or a shell element. In general, a plane element in the narrow sense is usually referred to as a 2D element with in-plane deformations, a plate element undergoes transverse deformation, and a shell element includes both in-plane and transverse deformations.

According to the above definitions, the "plane-like element" in mode (2) should be categorized into a shell element projected to a flat plane, for example.

The "formulating normal strains and shear strain of the plane-like element" in mode (2) may be "expanding the normal strains and shear strain of the plane-like element using the geometric parameters of a quadrilateral element. The "components" of strains are, for example, normal strains, in-plane shear strain, and transverse strains.

(3) The process according to mode (1), wherein the estimating step comprises a second calculating step of calculating the analysis error for each of the at least one assumed deformation mode, based on a difference between an analytical solution of strain energy of the element and an approximated solution of strain energy of the element, wherein the analytical solution is calculated based on a true stress and strain distribution within an element domain, not through a finite element analysis, while the approximated solution is calculated through a finite element approximation.

The process according to mode (3) allows calculation of the analysis error based on the difference between the analytical and the approximated solution of the strain energy of the element. The analytical solution is a calculation of the strain energy of the element, not using the finite element method, but using a true stress state of the element. To the contrary, the approximated solution is a calculation of the strain energy of the same element using a finite element approximation.

(4) The process according to mode (3), wherein the second calculating step comprises a solution calculation step including:

defining a single representative element of a plurality of elements cooperating to approximately represent the shape of the object; and calculating the analytical solution and the approximated solution of the strain energy for the representative element, in consideration of the representative element, not in consideration of other elements.

It is possible to calculate the analytical and the approximated solution of the strain energy for each of a plurality of elements cooperating to approximately represent the shape of an object, using not only the present element, but also other elements founded on different finite element approximation schemes. However, it is also possible to calculate the analytical and the approximated solution of the strain energy by considering one element representing the plurality of elements on behalf of these elements, not by considering other elements, and is also possible to estimate the aforementioned analysis error within an allowable range of accuracy using these calculations.

Based on the findings described above, the process according to mode (4) has been provided.

(5) The process according to any one of modes (1) through (4), wherein the distortion is expressed with a plurality of geometry parameters mutually independently expressing geometric properties of the element.

(6) The process according to mode (5), the plurality of geometry parameters at least comprise: an aspect ratio of a real shape of the element; skew of the real shape of the element relative to a basis rectangle having the same aspect ratio as the real shape; and trapezoid of the real shape of the element relative to the basis rectangle.

The process according to mode (6) allows the distortion of an element to be expressed by means of a plurality of geometric parameters which are independent of each other and which at least include the aspect ratio, the skew, and the trapezoid, of the element.

The "aspect ratio" in mode (6), which refers to the ratio between the longitudinal dimension of the real shape of the element, may be calculated using any type of expression or formula. The "skew" in mode (6), which refers to the amount of inclination of the real shape of the element relative to a reference shape, i.e., the shape of a basis rectangle, may be also calculated using any type of expression or formula. The "trapezoid" in the mode (6), which refers to the amount of divergence of the real shape of the element relative to the reference shape, may be still also calculated using any type of expression or formula.

The "real shape of the element" in mode (6) may be interpreted to mean the shape of each of a plurality of elements into which an object has been partitioned.

(7) The process according to mode (6), wherein the skew is defined with an amount of skew of the real shape of the element relative to the basis rectangle, and wherein the trapezoid is defined with an amount of taper of the real shape of the element relative to the basis rectangle.

The present inventors have found that, in expressing the distortion of an element by means of a plurality of geometric parameters which are linearly independent of each other and which at least include the aspect ratio, the skew, and the trapezoid, of the element, it is important to define the skew using the amount of skew of the real shape of the element relative to the basis rectangle, and to define the trapezoid using the amount of taper of the real shape of the element relative to the basis rectangle.

Based on the findings described above, the process according to mode (7) has been provided.

The "amount of skew" in mode (7) may be defined as the amount of shear deformation to which the basis rectangle is required to be subjected, in order for the basis rectangle, upon shear deformation, to represent or coincide with the real shape of the present element.

(8) The process according to mode (6) or (7), the plurality of geometry parameters further comprise an amount of warping or distortion of the real shape of the element relative to the basis rectangle.

The process according to mode (8) allows expression or representation of the distortion of the element by considering the warping or distortion of the element as well, resulting in easier improvement in accuracy of expression or representation of the distortion in comparison with when the same element is expressed without considering the warping or distortion.

(9) The process according to any one of modes (5) through (8), wherein the estimating step comprises:

estimating the analysis error associated with each of the plurality of geometry parameters, the estimated analysis error being each of a plurality of individual analysis errors; and estimating the analysis error due to an entire of the distortion of the element as a total analysis error, based on the plurality of individual analysis errors estimated in association with the plurality of geometry parameters, respectively.

A study of the present inventors has revealed the fact that expression or representation of the distortion of an element by means of a plurality of mutually-independent geometric parameters would allow estimation of the analysis error due to the distortion, in association with each of the plurality of geometric parameters.

In view of the above findings, in the process according to mode (9), the analysis error is estimated as an individual analysis error associated with each of the plurality of mutually-independent geometric parameters. Further, based on a plurality of individual analysis errors which have been estimated in association with the plurality of geometric parameters, respectively, the analysis error due to the entire distortion of the element is estimated as a total analysis error.

(10) The process according to mode (9), wherein the estimating step is implemented to estimate the total analysis error in consideration of a synergistic effect of the plurality of geometric parameters upon the analysis results, based on the estimated plurality of individual analysis errors.

A study of the present inventors has also revealed the fact that the total analysis error due to the entire distortion of the element may possibly be larger than the simple sum of the plurality of individual analysis errors due to respective components of the total distortion of the same element, which components are expressed by means of the plurality of geometric parameters, respectively. The reason may be inferred to be that the plurality of geometric parameters have a synergistic effect on the analysis results.

Based on the findings described above, the process according to mode (10) has been provided.

(11) A process of estimating by a computer an analysis error occurring in analysis results of deformation of an object by a finite element method with use of a set of a plurality of elements approximately representing a shape of the object, the process comprising:

a deformation-mode determination step of determining at least one of tension, bending, shear, and torsion as a deformation mode expected to occur in each of the plurality of elements during deformation of the object, for each element, according to a command issued from a user of the computer to direct determination of the deformation mode; and a visualizing step of, upon determination of the deformation mode, for at least one of the plurality of elements, quantitatively visualizing the analysis error due to geometric distortion of each element.

The process according to mode (11) allows, upon determination of the deformation mode, a quantitative visualization of the analysis error due to the geometric distortion of each element, for at least one of a plurality of elements representing an object to be analyzed.

The quantitative visualization may be of a type permitting a numerical display of the analysis error, of a type permitting a graphical display of the analysis error with diagrams, graphs, colors, etc., for example.

(12) The process according to mode (11), wherein the process is performed prior to a numerical analysis of the set by the finite element method.

The process according to mode (12) is performed prior to implementation of the numerical analysis by the finite element method using a set of a plurality of elements together representing an object. Therefore, the process would not require an implementation of the numerical analysis by the finite element method using the entire of the plurality of elements in order to obtain the analysis error due to the distortion of a selected one of the plurality of elements, resulting in easier reduction in time required to obtain the analysis error.

(13) The process according to mode (11) or (12), further comprising an estimating step of estimating the analysis error using the computer, for each element, based on the determined deformation mode, according to an element-distortion-to-analysis-error relationship previously estimated between geometric distortion of each element and the analysis error occurring due to the geometric distortion in the analysis results by the finite element method, and wherein the visualizing step is implemented to visualize the estimated analysis error.

(14) The process according to mode (13), wherein the element-distortion-to-analysis-error relationship has been estimated by the process according to any one of modes (1) through (10).

(15) The process according to mode (13) or (14), wherein the distortion is expressed with a plurality of geometric parameters mutually independently expressing geometric properties of each element, wherein the estimating step comprises an individual-analysis-error estimation step of estimating the analysis error in association with each of the plurality of geometric parameters as an individual analysis error, and wherein the visualizing step is implemented to visualize the estimated individual analysis error for each of the plurality of geometric parameters, in association with each of the at least one element.

(16) The process according to any one of modes (13) through (15), wherein the estimating step comprises a total-analysis-error estimation step of estimating the analysis error due to an entire distortion of each element as a total analysis error, in association with each of the at least one element, and wherein the visualizing step is implemented to visualize the estimated total analysis error in association with each of the at least one element.

(17) The process according to mode (16), wherein the visualizing step comprises a distinctive display step of displaying the plurality of elements to allow a user of the computer to visually distinguish between at least one of the plurality of elements which each has the estimated total analysis error not less than an allowable value, and at least one of the plurality of elements which each has the estimated total analysis error less than the allowable value.

(18) A process of estimating deformation of an object by a finite element method with use of a set of a plurality of elements approximately representing a shape of the object, using a computer, the process comprising:

a partition step of partitioning the shape of the object into the plurality of elements, using the computer;

a deformation-mode determination step of, upon partition into the plurality of elements, determining at least one of tension, bending, shear, and torsion as a deformation mode expected to occur in each element during deformation of the object, for each element, according to a command issued from a user of the computer to direct determination of the deformation mode;

a visualizing step of, in response to determination of the deformation mode, for at least one of the plurality of elements, quantitatively visualizing an analysis error occurring due to geometric distortion of each element in analysis results of the deformation of the object by the finite element method; and an analyzing step of analyzing the deformation of the object with use of the set by the finite element method, using the computer.

(19) A computer program executed by a computer to perform the process according to any one of modes (1) through (18).

The execution of the program according to mode (19) by a computer makes it possible to provide basically the same effects in accordance with basically the same principle, both as with the process according to any one of modes (1) through (18).

The "program" in mode (19) may be interpreted to include not only a set of instructions to be executed by a computer so that the program may function, but also any file or dada to be processed by a computer according to the set of instructions.

Also, the desired functions of the "program" in mode (19) may be accomplished by executing only the program by a computer, or may be accomplished by executing the program and other programs by a computer. In the latter case, the program according to mode (19) may be structured principally with data.

(20) A computer-readable storage having stored thereon the computer program according to mode (19).

The execution of the program stored in the storage medium according to mode (20) would provide basically the same functions and effects as with the process according to any one of modes (1) through (18).

The "storage medium" in mode (20) may be realized in different types, including a magnetic recording medium, such as a flexible disk, an optical recording medium, such as a CD and a CD-ROM, an optical-magnetic recording medium, such as an MO, an unremovable storage, such as a ROM, etc., for example.

(21) An apparatus for implementing the process according to any one of modes (1) through (18) by a computer.

Several presently preferred embodiments of the invention will be described in detail by reference to the drawings in which like numerals are used to indicate like elements throughout.

A numerical analysis method will be described in accordance with one embodiment of the present invention. The numerical analysis method is for analyzing the deformation of a structure which is an object to be analyzed by a finite element method with the use of a set of a plurality of elements approximately representing the shape of the structure.

The numerical analysis method, roughly described, is performed such that the structure is automatically partitioned into a plurality of elements, and an analysis error which is expected to occur, due to the distortion of each element, in the resulting analysis results by the finite element method is estimated for each element. The distortion of each element appears as a result of mesh generation as described later. A researcher is then informed of at least one of the plurality of elements, which has the estimated analysis error exceeding a predetermined allowable value, if any. As a result, the researcher becomes capable of partitioning again the same structure into a plurality of elements so as not to generate an element causing the analysis error to exceed the allowable value, namely, so as not to generate an element having such an excessive distortion as to increase the analysis error.

Further, the numerical analysis method is performed such that the deformation of the object is analyzed by the finite element method, in response to a command issued from the researcher to direct implementation of analysis using the plurality of elements each of which has been fixed in shape.

In the embodiment of the present invention, the analysis error is estimated based on the following novel findings proposed by the present inventors:

(1) Definition of Element Distortion

The geometric shape of an arbitrary element can be expressed with a plurality of linearly independent distortion modes (geometry parameters). In other words, the shape of an element can be expressed as a linear combination of the distortion modes.

In the regard, the plurality of distortion modes, when the warping of an element is discarded, contain a mode related to the aspect ratio of the element, modes related to the skew (the amount of skew) of the element in two orthogonal directions, and modes related to the trapezoid (the amount of taper) of the element in two orthogonal directions, but exclude other modes.

Therefore, the element distortion is defined only by the aspect ratio, the skew, and the trapezoid.

(2) Definition of Element Displacement

The displacement of an element can be expressed with a plurality of linearly independent deformation modes. In other words, the element displacement can be expressed as a linear combination of the deformation modes.

In the regard, the plurality of distortion modes contain translation modes in respective two orthogonal directions, stretch or tension modes in respective two orthogonal directions, shear modes (pure shear modes) in respective two orthogonal directions, and bending modes (pure bending modes) in respective two orthogonal directions, but exclude other modes.

(3) Correlation Between Element Distortion and Analysis Error due to Element Distortion If a distortion mode of an element has been determined, a constant relationship, dependent on the determined deformation mode, between the determined distortion mode and analysis error due to the determined distortion mode, will be established. The analysis error due to the element distortion can be analyzed, with the analysis error being decomposed into components for the respective deformation modes of the element.

Then, the theoretical background of the above findings will be explained below.

It is impossible to idealize a region whose boundary is formed with a curved line or a curved surface, by means of elements whose boundaries are formed with straight lines or flat surfaces. For the reason, a type of element having a curved line or a curved surface has been developed. Since the type of element is equivalent to a rectilinear element under parameter environment, the type of element is referred to as "isoparametric element."

Therefore, a case may arise where the isoparametric elements are employed for the analysis of complex structures. In this case, the structures are often discretized into irregular quadrilateral plane elements (panel elements), involving a distorted mesh (element). To deal with arbitrary quadrilateral elements for practical purposes, a distorted element is mapped into a basis square element with the introduction of the bilinear shape functions defined with the natural coordinates ($\xi$, $\eta$). Within an isoparametric element, internal displacement distribution is also approximated by the same bilinear shape functions, and an incomplete linear strain variation is obtained by taking the displacement derivatives with respect to the object or physical coordinates (x, y). Then, the corresponding stress and element stiffness matrix can be computed in terms of nodal displacement vectors.

Independent of the type of finite element, approximation accuracy decreases as the element aspect ratio differs from unity, and as the shape of the element is altered from a rectangle. The reason of the deterioration of approximation accuracy due to an irregular mesh is found in the Jacobian matrix. The matrix directly reflects the element geometry in coordinate transformation of the differential operators in the evaluation of strains or the shape function derivatives when calculating the element stiffness matrix. Then, the influence of element distortion upon approximation accuracy particularly in strain distribution will be examined with regard to a class of isoparametric quadrilateral elements.

Element distortion parameters are defined by means of expressing the geometry of an arbitrary element as a combination of skew distortion and trapezoidal distortion in conjunction with the aspect ratio. Both of the skew distortion and the trapezoidal distortion are defined relative to a basis rectangle denoting its aspect ratio. As a result, the Jacobian matrix is described in terms of the element distortion parameters. In order to observe which terms accompany element distortion for an isoparametric quadrilateral element, the strain components are expanded with respect to the inverse Jacobian matrix.

The element distortion is defined as follows:

The geometry of an isoparametric element is assumed by bilinear polynomials with respect to the parametric natural coordinates $\xi$ and $\eta$ which are uniquely identified in an element domain as Equation 1.1 in FIG. 1.

In the equation, $N_i$ ($\xi$, $\eta$) are the bilinear shape functions defined by Equation 1.2 in FIG. 1. The functions establish the coordinate relationships between the object coordinates and the parametric coordinates for two-dimensional elements. Each coefficient in Equation 1.1 is expressed as Equation 1.3 in FIG. 1. In Equation 1.3, $h_0$ through $h_3$ are orthogonal vectors, and their values are expressed as Equation 1.4 in FIG. 2. The nodal coordinate vectors x, y in Equation 1.3 is expressed as Equation 1.5 in FIG. 2.

Following the above notation, the Jacobian matrix, which is utilized in the transformation of differential operators, can be expressed as Equation 1.6 in FIG. 2.

Because the Jacobian matrix maps an arbitrary quadrilateral element onto a square region whose side length is two, the Jacobian matrix components are directly related to the geometry of the element. To specifically show this correlation, the Jacobian matrices of rectangular, parallelogram and trapezoidal elements are examined next.

As shown in FIG. 3, the geometry of an arbitrary quadrilateral element defined in the local coordinate system (x, y) is categorized into the following four distortion modes: skew in the x and y directions and trapezoid in the x and y directions, along with the aspect ratio of the basis rectangle. Several types of element distortions are shown in FIG. 3.

According to the dimensions given in FIG. 3, the geometry of the basis rectangle, parallelograms, and trapezoids are written utilizing the orthogonal vectors $h_1$, $h_2$, $h_3$ expressed as Equation 1.7 in FIG. 4. In the equation, the left side of the top expression denotes the nodal coordinates of the basis rectangle, the left sides of the second and third expressions denote the nodal coordinates of the parallelogram, and the left sides of the fourth and bottom expressions denote the nodal coordinates of the trapezoid.

Moreover, the aspect ratio of the element is the ratio of the side lengths of the basis rectangle. Further, the amount of distortions, i.e., the amount of skew and trapezoidal deformation in the x and y directions, of an arbitrary quadrilateral element can be viewed as the differences from the rectangle. The differences are described as Equation 1.8 in FIG. 4, which is equivalent to Equation 1.9 in FIG. 4.

Because $h_1$, $h_2$, and $h_3$ are linearly independent, the effect of each distortion upon approximation accuracy can be examined separately. Now, due to the orthogonality condition $h_i^T h_j = 4 \delta_{ij}$ ($\delta_{ij}$: Kronecker's delta), the substitution of the above nodal coordinates into Equation 1.3 yields Equation 1.11 in FIG. 5. The equation shows that the coefficients $a_i^x$ and $a_i^y$, i=1, 2, 3 are in fact exactly the dimensions of the basis rectangle and the distortion parameters, while the average of the four coordinates $a_0^x$ and $a_0^y$ indicate the location of the element centroid. With the use of distortion parameters, the internal coordinates in Equation 1.1 are also written as Equation 1.12 in FIG. 5.

($x_0$, $y_0$) in Equation 1.12 is the coordinate of the element centroid, i.e., the origin of the local coordinate system. Moreover, geometry parameters $h_x$, $h_y$, $\alpha_1$, $\alpha_2$, $\alpha_3$, and $\alpha_4$ are expressed as Equation 1.13 in FIG. 5.

Substituting these geometry parameters into Equation 1.10 provides the relationship expressed as Equation 1.14 in FIG. 5.

Figure 6:
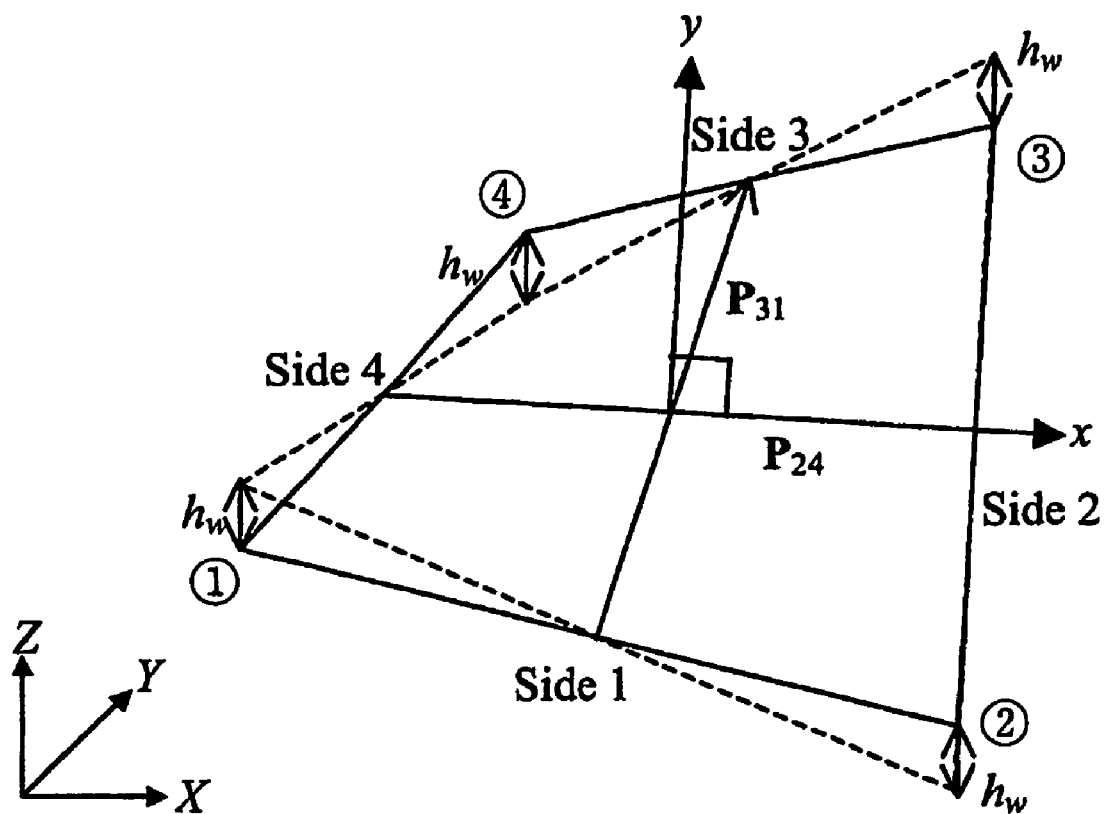
FIG. 6 illustrates the setup of a local coordinate system x-y-z in the aforementioned principle of estimation and the warping of a quadrilateral element in the local coordinate system.

Now, an example of an arbitrary quadrilateral is considered in order to actually obtain its geometry parameters. Before doing so, it is necessary to define the local coordinate system assigned uniquely in an element. In FIG. 6, the setup of the local coordinate system is illustrated.

First, if a quadrilateral is warped, which means that the four corner nodes do not lie on the same plane, then the quadrilateral is projected onto a flat surface such that the distances between the nodes of the flat plane and the quadrilateral become the same. This provides a plane element (shown with solid lines in FIG. 6) corresponding to the original quadrilateral element (shown with broken lines in FIG. 6). The nodal coordinates of the original quadrilateral in the direction perpendicular to the plane element are $h_w h_3$ wherein $h_w$ means a projection height. Although warping is a major factor of a decline in the approximation accuracy of the shape of a structure, at present only the distortion in the plane direction is considered.

Now, the origin of the local coordinate system is set at the centroid of the plane element. This is expressed as Equation 1.15 in FIG. 7. X and Y in Equation 1.15 are the global coordinates of the four corner nodes.

Next, each side of the plane element is bisected, and two vectors connecting the midpoints on the opposite sides $P_{24}$ and $P_{31}$ are found by Equation 1.16 in FIG. 7. The vector $P_{24}$ is set as the direction of the local x axis, and then the y axis is defined perpendicular to the x axis. This is expressed as Equation 1.17 in FIG. 7. The suffixed $P_{24}$ in Equation 1.17, to which a special symbol is suffixed, is represented as Equation 1.18 in FIG. 7.

The local coordinates $\{x_i, y_i\}$ are attained by converting the location vectors with respect to the element centroid, utilizing the coordinate transformation matrix $T=[e_x, e_y]$. This is described as Equation 1.19 in FIG. 8.

Finally, the amount of distortion contained in the plane element is found by Equation 1.13 in FIG. 5.

Figure 11:
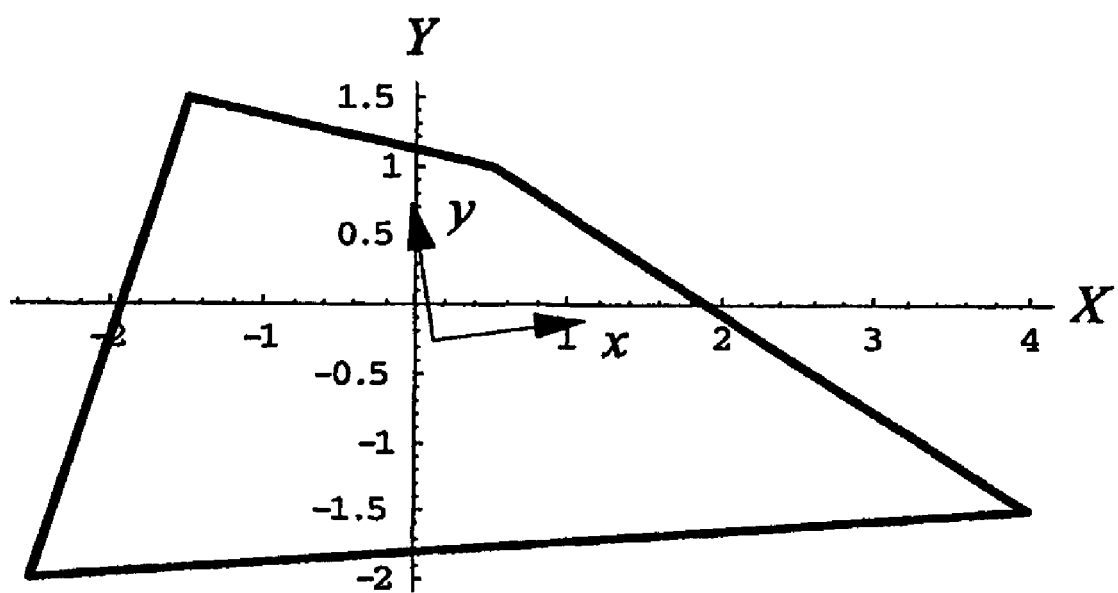
FIG. 11 illustrates the local coordinate system of an arbitrary quadrilateral element for explaining the aforementioned theoretical background of principle of estimation.

Now, an arbitrary shaped quadrilateral element, the nodal global coordinates $X_i, Y_i$ (for nodes 1, 2, 3, and 4) of which are listed in the table of FIG. 9, is considered as an example. The location of the origin of the local coordinate system is found by taking the average of the four nodal coordinates, as expressed as Equation 1.15 in FIG. 7, and the unit axis vectors $e_x$, $e_y$ are obtained by computing Equation 1.17 in FIG. 7, as in the table of FIG. 9. Then, applying the coordinate transformation matrix, the nodal coordinates $x_i$, $y_i$ are found as in the table of FIG. 10. The arbitrary quadrilateral and its local coordinate system x-y are also shown in FIG. 11. In FIG. 11, X-Y denotes the global coordinate system.

Utilizing Equation 1.13 in FIG. 5, the geometry parameters of this quadrilateral are obtained as follows:

$h_x = (1/4) h_1^T x = 2.1033$ $h_y = (1/4) h_2^T y = 1.5738$

Figure 12:
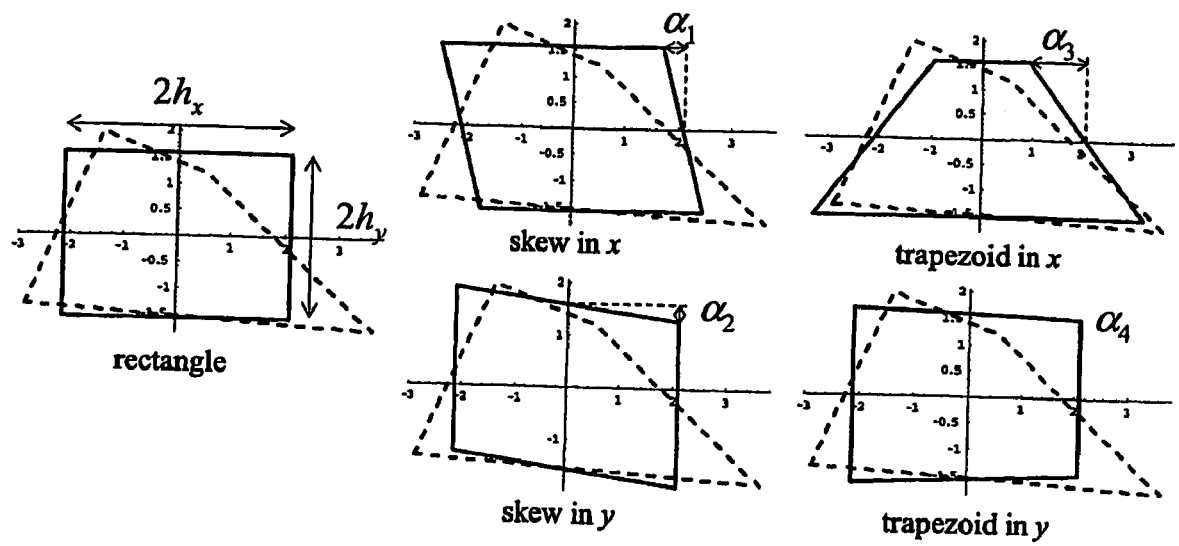
FIG. 12 illustrates how an arbitrary quadrilateral element is decomposed into a plurality of kinds of distortions according to the aforementioned principle of estimation.

Aspect Ratio = $h_x/h_y = 1.3364$ $\alpha_1 = (1/4) h_2^T x = -0.4048$ $\alpha_2 = (1/4) h_1^T y = -0.3029$ $\alpha_3 = (1/4) h_3^T x = -1.1491$ $\alpha_4 = (1/4) h_3^T y = -0.08709$ Further, from Equation 1.10 in FIG. 4, it can be verified that the nodal coordinates are expressed as the linear combination of the orthogonal vectors $h_1$, $h_2$, and $h_3$, whose coefficients are the geometry parameters obtained here. It is also recognized that trapezoidal distortion in the x direction is the dominant distortion type contained in this particular quadrilateral element. As defined earlier, the arbitrary quadrilateral is composed of the basis rectangle enhanced with the four distortion types: skew in the x and y directions, and trapezoid in the x and y directions, as seen in FIG. 12. In FIG. 12, the original distorted element is depicted with broken lines, while the amount of skew or trapezoid contained in the corresponding distorted element is depicted with solid lines according to the definition of distortions described above.

In accordance with the modes of element distortion defined thus far, the Jacobian matrix of a quadrilateral element expressed as Equation 1.6 in FIG. 2 now can be expressed in terms of geometric properties as Equation 1.20 in FIG. 13.

Figure 14:
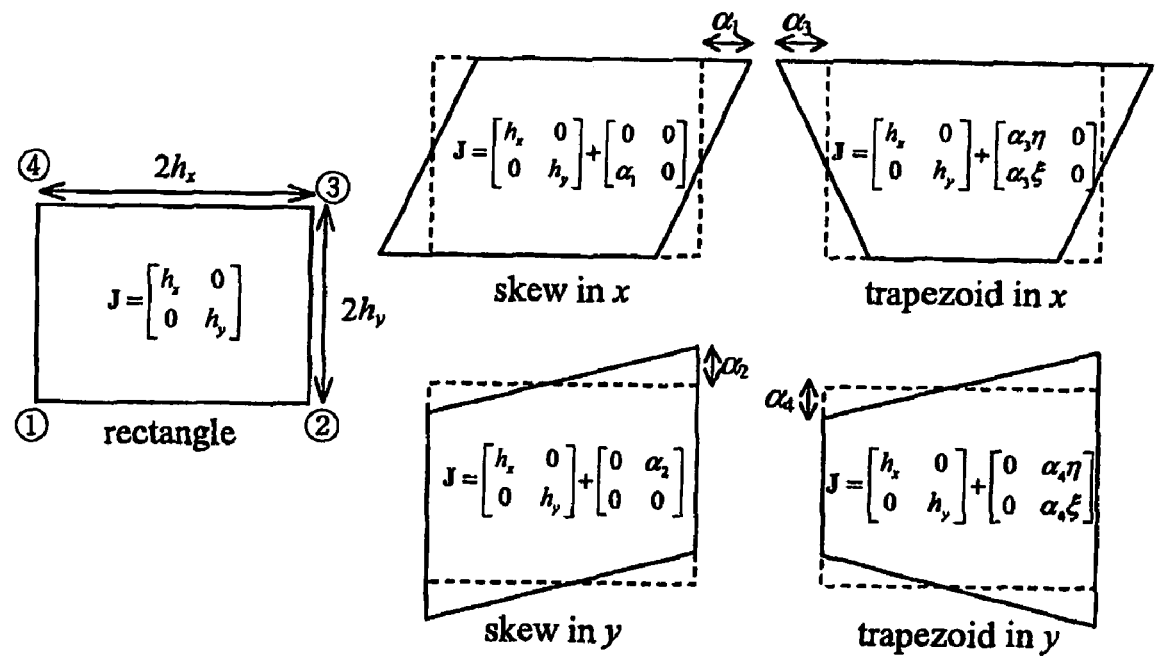
FIG. 14 illustrates a plurality of deformation modes in the aforementioned principle of estimation paired with the respective Jacobian matrices.

Alternatively, the Jacobian matrix can be decomposed into three parts: constant diagonal term, constant non-diagonal term, and linear term, as expressed as Equation 1.21 in FIG. 13. The first constant term with diagonal components represents the basis rectangle; the second constant term with non-diagonal components indicates skew of the element; and the third linear part stands for the trapezoidal distortion. In FIG. 14, the distortion modes and the Jacobian matrices are shown.

In other words, because an arbitrary element shape is composed of a sum of distortion quantities added to the basis rectangle, the Jacobian matrix also consists of the rectangle term enhanced with the constant non-diagonal skew term and the linear trapezoidal term, as shown in FIG. 14. It is observed that the Jacobian matrix is constant when the element is a rectangle or parallelogram, and becomes linear when trapezoid.

The determinant of the Jacobian matrix, which is a measure of how a coordinate transformation changes the area of a unit region, is a linear function expressed as Equation 1.22 in FIG. 15. Now, $J_0$, $J_1$, and $J_2$ are represented as Equation 1.23 in FIG. 15.

Also, the Jacobian determinant related to geometric quantities is expressed as Equation 1.24 in FIG. 15.

Evidently, the Jacobian determinant is also constant for rectangular and parallelogram elements. Moreover, the inverse of the Jacobian matrix becomes Equation 1.25 in FIG. 15. The derivatives with respect to the Cartesian coordinates are obtained by transforming those with regard to the parametric coordinates utilizing the inverse Jacobian matrix. This is represented as Equation 1.26 in FIG. 16.

It is preferred for the purpose of numerical evaluations to express the above differential operators using polynomials rather than the present rational functions. For this reason, the inverse of the Jacobian determinant $1/J$ ($\xi$, $\eta$) may be expanded by the Taylor series about the element centroid. This is represented as Equation 1.27 in FIG. 16. By taking up to the first order terms, the inverse Jacobian matrix is approximated by Equation 1.28 in FIG. 16.

Alternatively, the Taylor's theorem may be applied to the inverse Jacobian matrix itself, leading to another approximation expressed as Equation 1.29 in FIG. 16. Replacement of the inverse Jacobian matrix by either of these approximations allows the shape function derivatives to be written in the polynomial form.

The in-plane displacement distribution of an isoparametric element is assumed by the same bilinear shape functions $N_i$ ($\xi$, $\eta$) utilized for the coordinate approximation. The internal displacement functions of an isoparametric element are expressed as Equation 1.30 in FIG. 17. Now, the coefficients of the polynomials are given by Equation 1.31 in FIG. 17. The nodal displacement vectors u, v are expressed as Equation 1.32 in FIG. 17.

Figure 18:
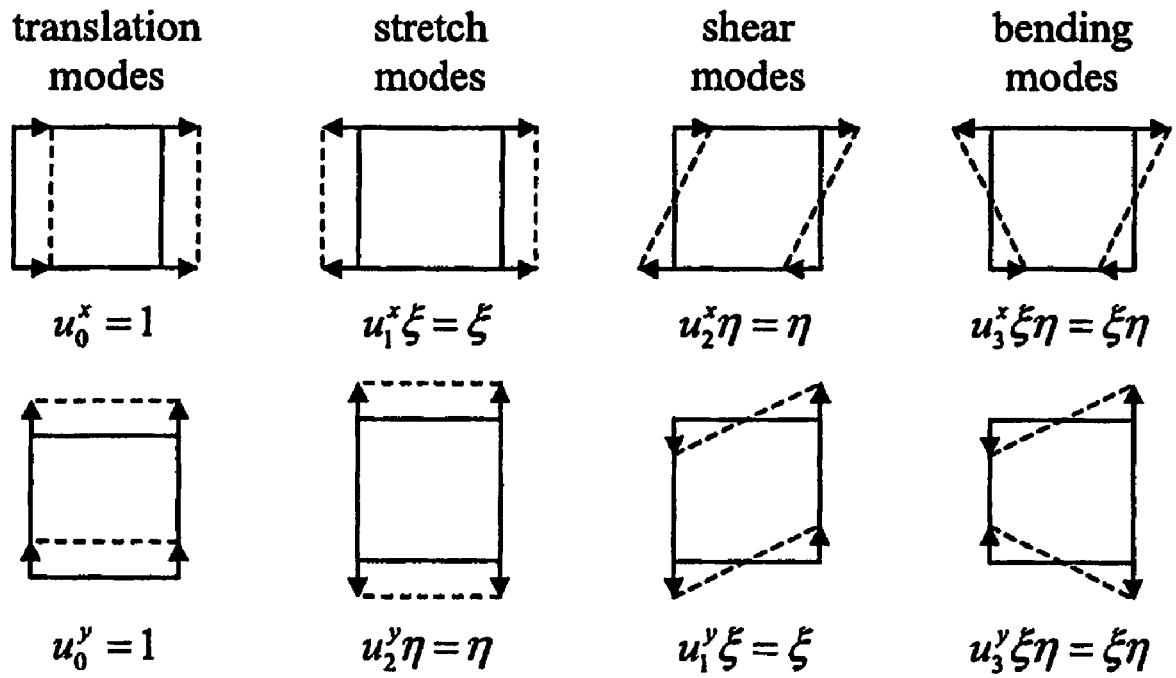
FIG. 18 illustrates a plurality of types of deformation modes of a bilinear isoparametric quadrilateral element for explaining the aforementioned theoretical background of principle of estimation.

Analogous to how element geometry is represented by a linear combination of skew and trapezoidal distortions added to the basis rectangle, deformation of an isoparametric element, as shown in FIG. 18, consists of the four modes in the x and y directions: translation (zero stress) modes, stretch or tension (constant normal stress) modes, shear (constant shear stress) modes, and bending (linear normal stress) modes. Rigid body motions include translation and rotation. The translation is represented by means of two translation modes in the x and y directions. The rotation is expressed by subtracting shear mode in the x direction from shear mode in the y direction.

By applying the coordinate transformation of differential operators expressed as Equation 1.26 in FIG. 16 to the displacement derivatives with respect to the natural coordinates, Equation 1.33 in FIG. 19 is obtained. The strain field is obtained as Equation 1.34 in FIG. 19.

From the above coordinate relationships of the differential operations, it is conceivable that the non-diagonal constant and linear functions contained in $j^{-11}$, $j^{-12}$, $j^{-21}$, and $j^{-22}$, which accompany skew and trapezoidal distortions of an element, contribute to the generation of excess strain energy. It is also understandable that the excess strain energy in turn causes stiff response of an element.

Each strain component is actually expanded to yield functions expressed as Equation 1.35 in FIG. 19. These functions can be written in the matrix form as in Equation 1.36 in FIG. 20. In the equation, "G" is represented as Equation 1.37 in FIG. 20.

Strains can be further rearranged, as expressed as Equations 1.38, 1.39, and 1.40 in FIG. 21, so that they are written with regard to the distortion parameters $\alpha_i$(i=1, 2, 3, 4).

For each strain component, the first part is associated with the basis rectangle; the second term appears when the element is skewed; and the third part corresponds to a trapezoidal distortion. It is a known fact that the pure bending modes do not produce any shear strain, and therefore $u_3^x$ and $u_3^y$ terms in shear component are to be discarded. Consequently, shear strain becomes constant when an element is rectangular, and unnecessary shear strain energy is removed. However, it is easily observed from FIG. 14 that the more an element is distorted, the bigger the distortion parameters (basis distortion parameters, geometry parameters) $\alpha_1$ to $\alpha_4$ become. Therefore, excessive strain energy within an element is generated. In other words, the strain energy stored in an element increases as the element becomes distorted even if its area stays the same.

From the close observation of each strain term, it is noted that $\epsilon_x$ contains geometry parameters $\alpha_2$ and $\alpha_4$ in the y direction paired with deformation modes in the x direction, while the deformation mode vectors (nodal displacement vectors) u, v (See Equations 1.31 and 1.32 in FIG. 17, and FIG. 18) are orthogonal to the corresponding geometry mode vectors (orthogonal vectors) $h_0$ to $h_3$ (See Equation 1.4 in FIG. 2). In the same manner, $\epsilon_y$ contains geometry parameters $\alpha_1$ and $\alpha_3$ in the x direction paired with deformation modes in the y-direction. On the other hand, geometry parameters $\alpha_1$ to $\alpha_4$ in $\gamma_{xy}$ are related to deformation modes of the same direction.

Also, rectangle and parallelogram geometry parameters are associated with the bending deformation (linear shear) mode, and the trapezoid geometry parameter corresponds to the linear deformation (constant shear) modes. In other words, element skew in one direction exaggerates the bending deformation energy in the other direction, whereas trapezoidal distortion in one direction overstresses stretch or tension and shear deformations in the other direction. Overall, it is desirable to avoid meshes with trapezoidal distortion because it always brings about linear strain distribution even when the real strain field is constant.

In the case of a rectangular element, the strain distribution is simplified to linear functions expressed as Equation 1.41 in FIG. 22.

While element distortion has been discussed above with a focus on plane elements, the analysis of a shell-type structure requires bending components of a flat plate to be considered as well. In this case, in-plane deformation is always coupled with out-of-plane deformation.

Then, a class of bending plate elements of the Mindlin-Reisner type (a plate element, the Mindlin plate) will be described below.

First, describing the modeling of a flat plate, the displacement of a flat plate $\{u_x, u_y, u_z\}$ at an arbitrary point P (X, Y, Z) in the global reference frame $\{X, Y, Z\}$ is expressed in the local coordinate system $\{x, y, z\}$. The x-y plane of the local coordinate system is positioned uniquely on the neutral plane of each plate element, while the z-axis is set up in the direction normal to that plane.

The displacement components are decomposed into in-plane and out-of-plane parts. The two-dimensional in-plane components are defined on the x-y plane, i.e., the neutral plane of the plate, and the transverse components are expressed as a function of z. For example, consider the x component of the displacement consisting of two parts as in Equations 2.1 and 2.2 in FIG. 23. Then, the displacement in three-dimensional field is expressed by asymptotic expansion as Equation 2.3 in FIG. 23.

It is sometimes preferred to select up to the third order terms creating a higher order plate element so that the shear effect is taken into account for the analysis of a thick plate. For a thin enough plate, the in-plane components of the displacement $u_x$ and $u_y$ are approximated to vary linearly in the thickness direction. The vertical displacement $u_z$ is assumed to stay constant over the thickness of the plate. These are expressed in Equation 2.4 in FIG. 23.

Figure 24:
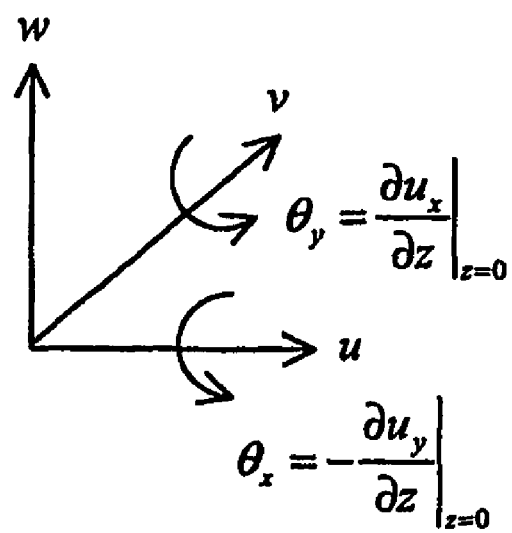
FIG. 24 illustrates five degrees of freedom of a plate element for explaining the aforementioned theoretical background of principle of estimation.

The displacement field of a plate is expressed in terms of five degrees of freedom $\{u, v, w, \theta_x, \theta_y\}$: three translations and two rotations, as shown in FIG. 24. These generalized displacements, which are also refer to rotations, are defined on the neutral plane and expressed as functions of x and y.

Following the above displacement approximation, the strains of a plate become to be expressed as Equation 2.5 in FIG. 25. This is also expressed in the matrix form as Equation 2.6 in FIG. 25.

Moreover, assuming plate stress ($\sigma_z$=0) condition, stress is obtained by the constitutive equation expressed as Equation 2.7 in FIG. 26. In the equation, $\kappa_x$ and $\kappa_y$ are the shear correction parameters.

Of the five generalized displacements, u and v are the in-plane part of the deformation, and w, $\theta_x$, and $\theta_y$ correspond with the plate bending deformation. This is expressed as Equation 2.8 in FIG. 26.

Consequently, the strain can be also separated into in-plane and transverse strain components. The in-plane part of the strain is caused by plane deformation $\{u, v\}$ as well as plate bending deformation $\{w, \theta_x, \theta_y\}$. This is expressed as Equation 2.9 in FIG. 26.

On the other hand, the transverse shear strains are related to the transverse deformation part only. This is expressed as Equation 2.10 in FIG. 27.

The strain energy of a plate is in turn separated into in-plane and out-of-plane parts. This is expressed as Equation 2.11 in FIG. 27. The material constant matrix $D_p$ (in-plane) and $D_s$ (out-of-plane) in Equation 2.11 are expressed as Equation 2.12 in FIG. 27.

Now, let A be the domain of a neutral surface, h be the plate thickness, S be the boundary of A, and the domain of the plate be $\Omega$=A×[−h/2, +h/2]. By taking the integral over the thickness of the plate, the strain energy due to transverse deformation is calculated as in Equation 2.13 in FIG. 27.

It can be observed from the second term in Equation 2.13 that as thickness h of the plate becomes smaller, the strain energy due to shear tends to predominate, thus shear locking occurs. This phenomenon is contradictory to the real behavior of a thin plate. This unnecessary shear effect results from the introduction of transverse shear strain in the thickness direction, which vanishes in a thin bending plate. In other words, as h tends to zero, transverse shear $\gamma_s$ must also approach zero; consideration of transverse shear effect in thin plate bending elements can be essentially interpreted as a constraint enforcing a zero shear strain condition.

It is added that, the displacement of a bending plate element (i.e., the Mindlin plate) can be expressed by means of out-of-plane deformation modes as with a plane element, and similarly, strain caused by a bending plate element can be expanded by means of distortion modes (distortion parameters, geometry parameters) and deformation modes.

Next, a change in strain energy due to element distortion will be explained concerning the Mindlin-type element.

Strain energy error $E_e$ is defined as Equation 3.1 in FIG. 29. In the equation, $U_e$ (u) indicates an analytical solution of strain energy, i.e., an analytical strain energy. This is defined by the strain energy equation represented as Equation 3.4 in FIG. 29. More specifically, the analytical strain energy $U_e$ (u) is calculated by substituting the true stress field into the strain energy equation and by taking the integral over the element domain.

Figure 28:
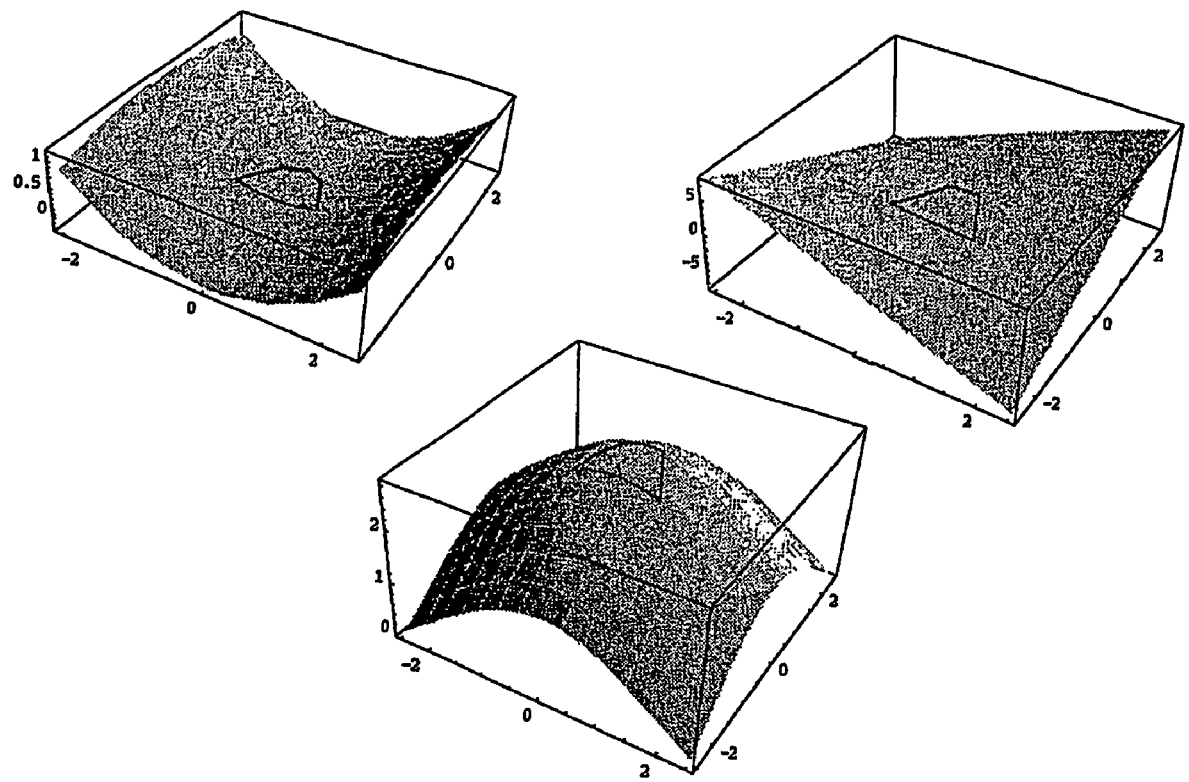
FIG. 28 is a perspective view illustrating how a quadrilateral element for explaining the aforementioned theoretical background of principle of estimation is distorted due to pure bending, torsion, and one-point loading.
Figure 35:
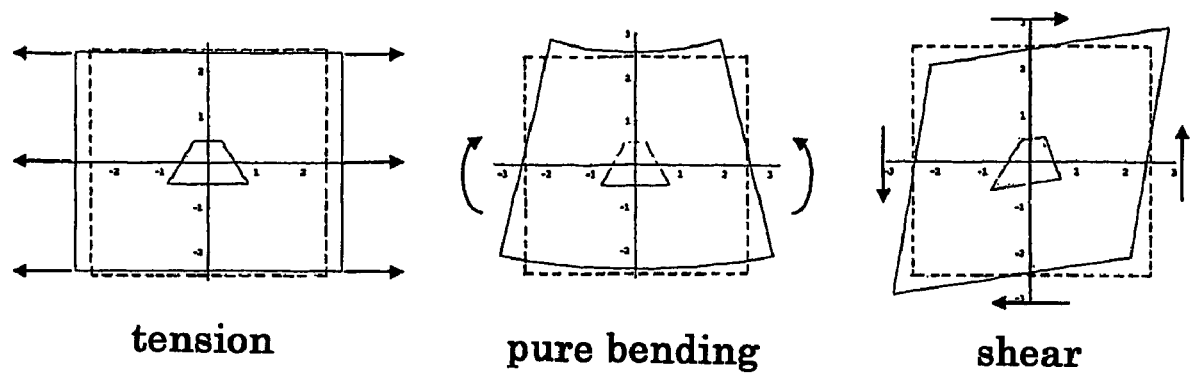
FIG. 35 illustrates how a quadrilateral element for explaining the aforementioned theoretical background of principle of estimation is distorted by tension, pure bending, and shear.

As shown in FIG. 35, a single quadrilateral with varying shape is placed in the middle of a large plate. The large plate is loaded with the uniform tension, pure bending, and pure shear. While FIG. 35 shows the in-plane deformations, FIG. 28 shows the transverse deformations.

For a beam-like structure, subjected to the in-plane pure bending, has a stress distribution expressed as Equation 3.2 in FIG. 29, and that the strain field of the beam-like structure under the in-plane pure bending is expressed as Equation 3.3 in FIG. 29. Therefore, by substituting the strain field into the strain energy equation expressed as Equation 3.4 in FIG. 29, and by selecting the element as an integral domain, the analytical strain energy $U_e$ (u) is obtained. "D" in Equation 3.4 denotes a material constant matrix.

Alternatively, $U_e$ ($u_h$) in Equation 3.1 in FIG. 29 indicates an approximated solution of strain energy, i.e., an approximated strain energy calculated by the finite element method. More specifically, $U_e$ ($u_h$) is the strain energy which is derived using the finite element stiffness matrix and the true nodal displacements d in Equation 3.10 in FIG. 33. In the case of a cantilever beam under pure bending, for example, the nodal displacement is obtained by substituting the nodal coordinates into Equation 3.5 in FIG. 30. Using the obtained true nodal displacement, the element strain energy by the finite element approximation is obtained by the application of Equation 3.10 in FIG. 33.

While the calculation of strain energy due to displacement u has been described above, strain energy due to displacement v is expressed as Equation 3.8 in FIG. 31. "D" in Equation 3.8 denotes a material constant matrix.

For a supplementary explanation about the notation, each suffix "e" appeared in $U_e$ (u) and $U_e(u_h)$ denotes that the corresponding "U" is strain energy for one element.

The nodal displacement for calculation of the approximated strain energy can be calculated using analytical displacement functions listed in the table of FIG. 32 for three given loading cases (pure bending, torsion, and one-point loading), or listed in the table of FIG. 44 for three given loading cases (uniform tension, in-plane bending, and in-plane shear). In the regard, a basis function $\phi_{ij}$(x, y) expressed as Equation 3.9 in FIG. 33 is utilized for the analytical solution of one-point loading problem.

It is added that, Equations 3.2 and 3.3 represent the stress field for an in-plane pure bending case shown in FIG. 35, and the exact solution for the case is expressed as Equation 3.5 in FIG. 30. That is to say, Equation 3.5 represents the exact solution for an in-plane bending (tension, bending, and shear) case. Substitution of the nodal coordinates of an element into Equation 3.5, and further substitution of the result into Equation 1.31 lead to Equation 3.6. However, this holds true with regard to a fixed end of a beam-like structure when a moment is applied thereto, for example.

As expressed as Equation 3.10 in FIG. 33, the approximated strain energy $U_e(u_h)$ is obtained from the real nodal displacement values d (approximated solution) with the element stiffness matrix (stiffness matrix of a distorted element) $K_e$. The true nodal displacement values d are calculated by substituting the nodal coordinates of a quadrilateral into the analytical displacement functions (See FIG. 32) provided above for each loading case.

Figure 34:
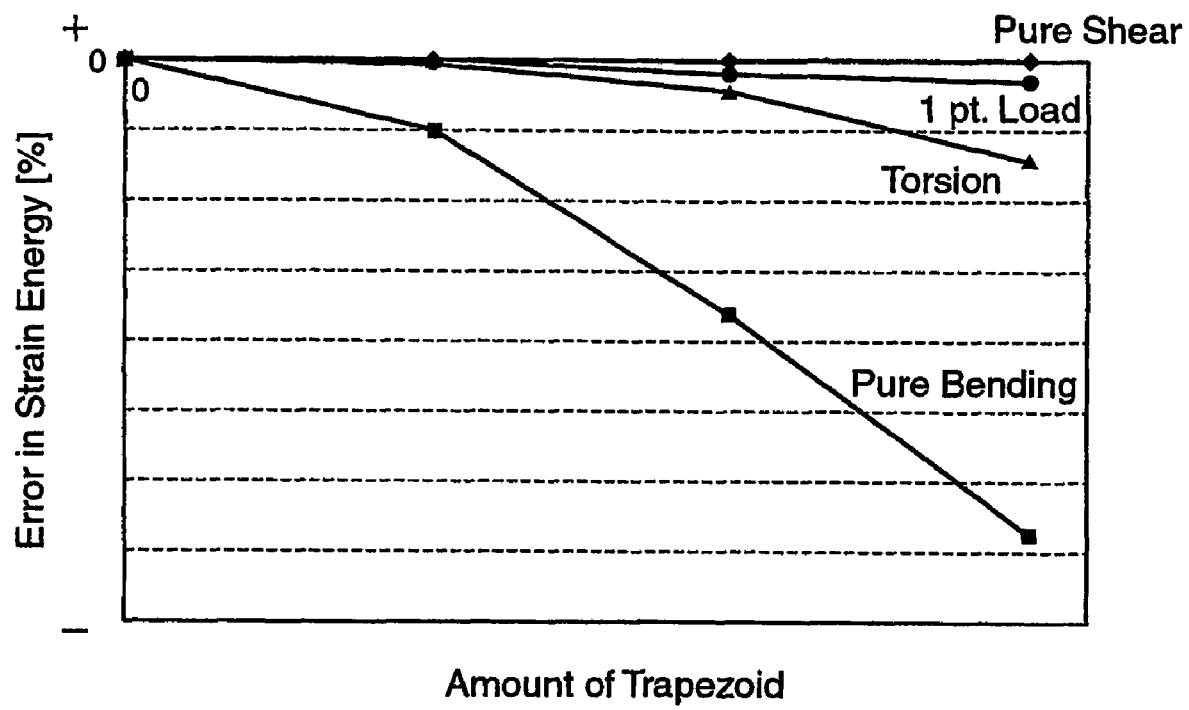
FIG. 34 is a graph illustrating how an error in strain energy estimated according to the aforementioned principle of estimation is changed depending on trapezoidal distortion of an element without shear correction.
Figure 45:
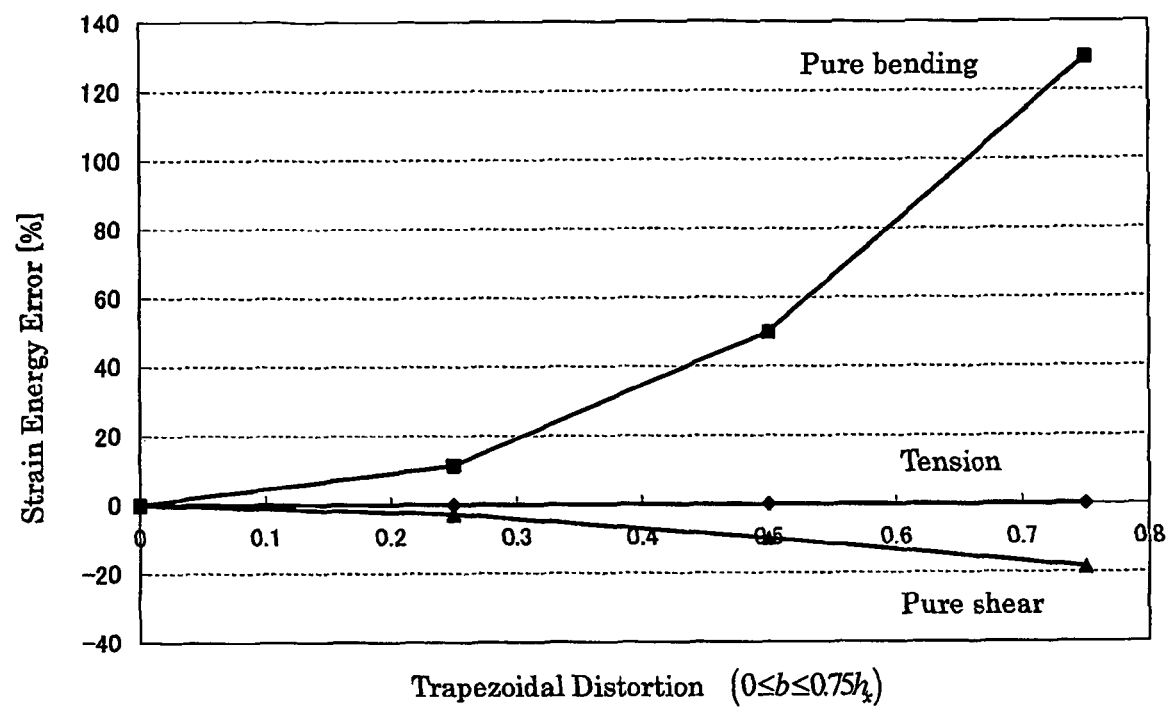
FIG. 45 is a graph illustrating how an error in strain energy estimated according to the aforementioned principle of estimation is changed depending on trapezoidal distortion of an element.

Especially in the case of an assumed stress element, from the calculation of strain energy error (error in strain energy) $E_e$, it is found that change in aspect ratio or skew distortion does not affect the approximation results in any way. Only trapezoidal distortion worsens the approximation accuracy of the assumed stress element. In FIG. 34, the strain energy error $E_e$ due to trapezoidal distortion or amount of trapezoid is plotted for each loading condition: pure shear, pure bending, one-point loading, and torsion. FIG. 35 illustrates how an element having trapezoidal distortion deforms under tension, pure bending, and shear, respectively. While FIG. 34 shows the transverse test results, FIG. 45 shows the in-plane test results for the uniform tension, pure bending, and pure shear.

The exact solution of strain energy is attained with a perfectly rectangular element; however, as trapezoidal distortion is increased, the in-plane bending behavior becomes very stiff. The stiff response of a trapezoidal element under bending is exaggerated when the aspect ratio becomes larger than unity. This trend can be examined by placing a tapered element with large aspect ratio similar to that of FIG. 35. The uniform tension and pure shear tests illustrate satisfaction of the constant strain patch test, which examines the ability to reproduce a constant strain state to prove the convergence of the element. In other words, if a distorted element does not generate strain energy error under tension and shear, then this element passes the patch test. The assumed-stress element, which was tested here, does not pass the so-called constant strain patch test because the strain energy error under pure shear does not stay constant as the element is tapered.

Figure 37:
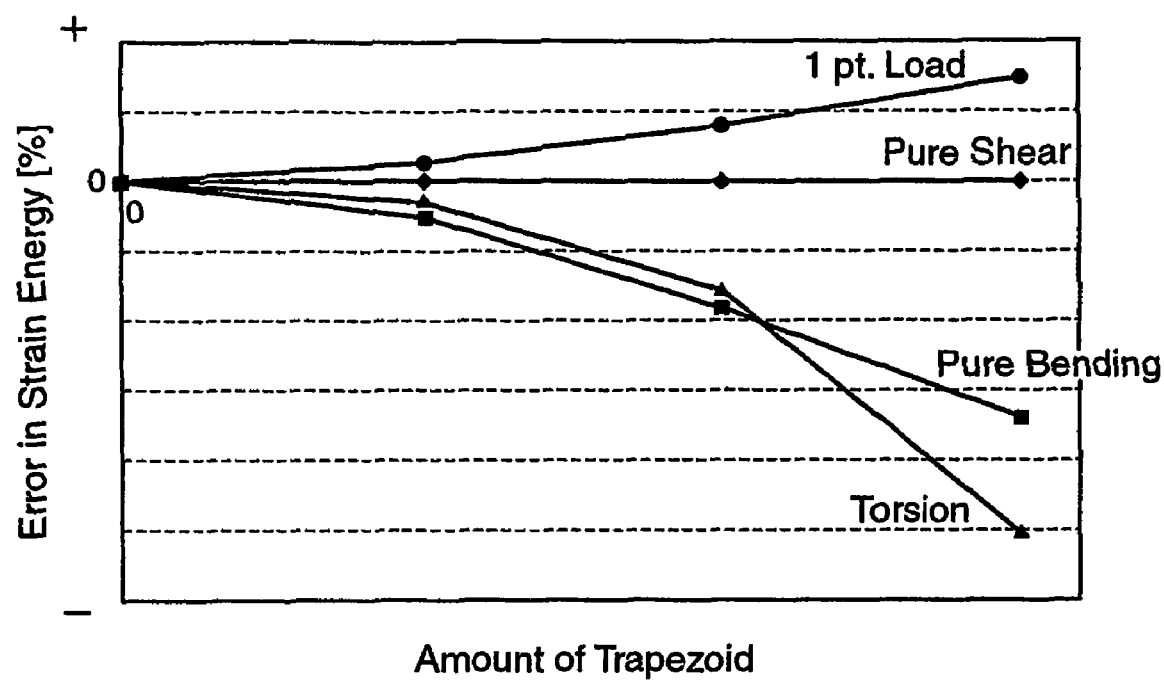
FIG. 37 is a graph for illustrating how an error in strain energy estimated according to the aforementioned principle of estimation is changed depending on trapezoidal distortion of an element with shear correction.

As trapezoidal distortion is increased, the plate bending behavior becomes unrealistic without a modification of the shear modulus. Not as bad as the plate bending, but when torsion is applied, the element stiffness becomes extremely large. To improve this unreasonable error increase caused by trapezoidal distortion, artificially modified shear modulus is considered. The transverse shear strains are altered simply by multiplying small correction factors (i.e., control parameters) $\kappa_x$ and $\kappa_y$. This is expressed as Equation 3.11 in FIG. 36. In FIG. 37, the strain energy error $E_e$ due to trapezoidal distortion upon correction of the shear modulus is plotted per each loading condition including pure shear, pure bending, one-point loading, and torsion.

Here, the control parameters are set to $\kappa_x=\kappa_y=0.31702$. As a result, the bending behavior is tremendously improved. On the other hand, since the control parameters $\kappa_x$ and $\kappa_y$ are designed to control the strain energy balance between bending and shear effect, torsion has not been affected by the control parameters $\kappa_x$ and $\kappa_y$ much.

While the numerical analysis method according to the present embodiment has been described above in particular with respect to the theoretical background of the principle to estimate analysis error due to element distortion, then the more specified approach in the numerical analysis method will be described in greater detail along with the explanation of a computer system for implementing the numerical analysis method.

Figure 38:
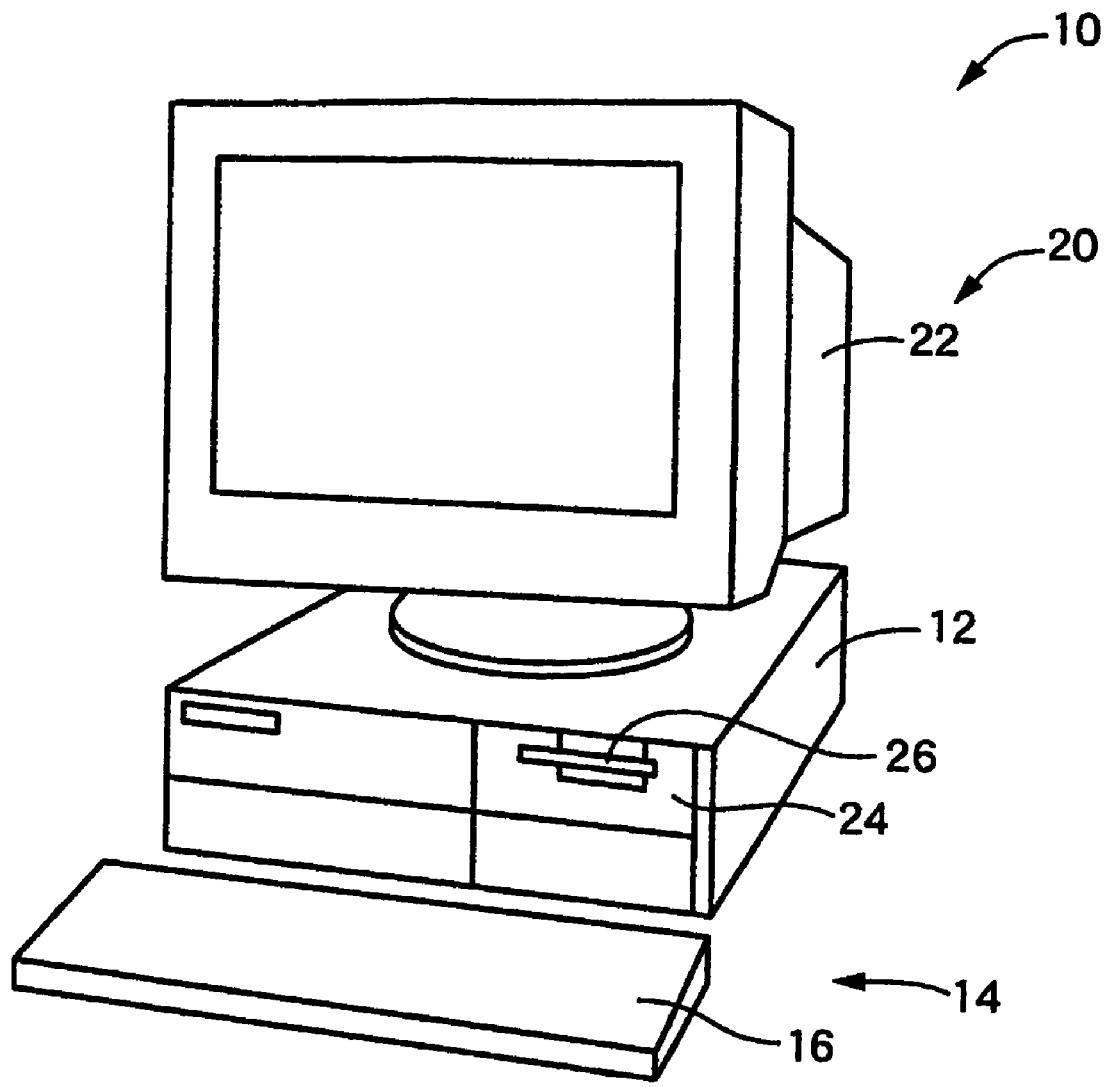
FIG. 38 is a perspective view illustrating a computer system 10 used for practicing the numerical analysis method.

FIG. 38 illustrates a computer system 10 in a perspective view. The computer system 10 includes a computer 12, an input device 14 in the form of a keyboard 16 and a mouse as not shown (one example of a pointing device), and an output device 20 in the form of a monitor 22.

While the monitor 22 shown in FIG. 38 is of a CRT type, the present embodiment may alternatively or additionally use a monitor of a different type, such as an LCD type. Also, while the computer system 10 shown in FIG. 38 is of a type allowing the computer system 10 to be used at a fixed position, the present embodiment may alternatively or additionally use a computer system of a mobile type.

Figure 39:
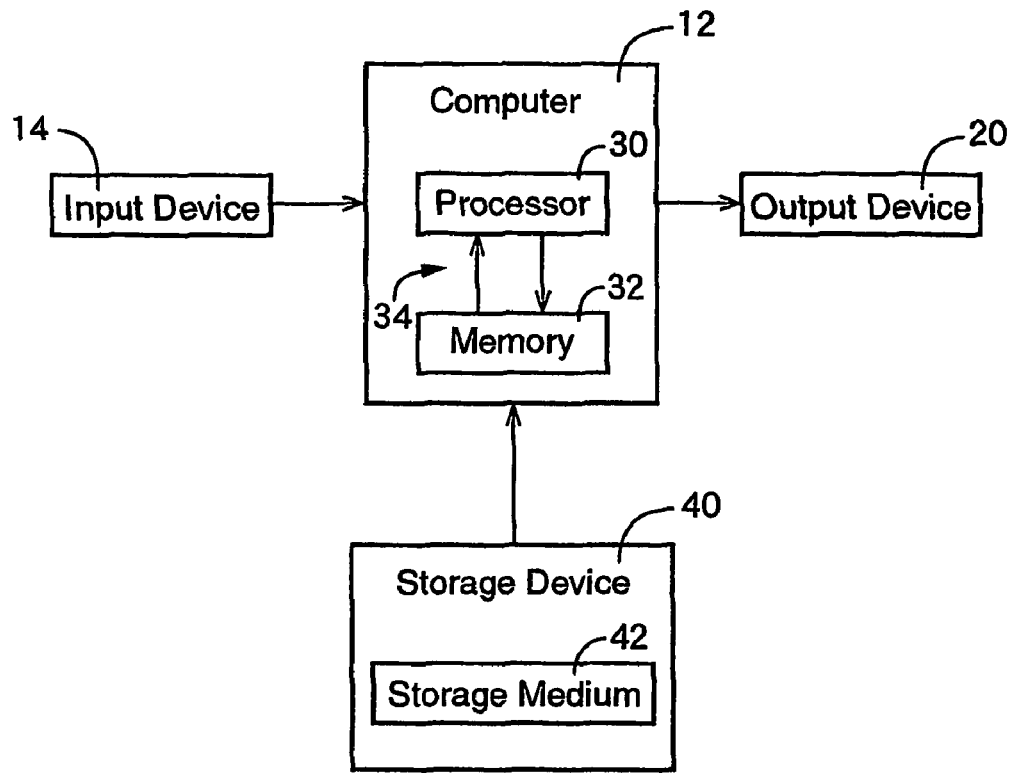
FIG. 39 is a block diagram schematically illustrating the hardware construction of the computer system 10 in FIG. 38.

As shown in FIG. 39, the computer 12 is, as is well known, configured such that a processor 30, such as a CPU, and a memory 32, such as a ROM, a RAM, etc. are connected via a bus 34.

The computer 12 is used in combination with a storage device 40. The storage device 40 is disposed to access data from and to a storage medium 42, such as a CD-ROM, an MO, etc. The storage device 42 has stored thereon a plurality of programs for implementing the numerical analysis method. The computer 12 is operated to retrieve a required program from the storage medium 42, and to, in turn, execute the retrieved program.

Figure 40:
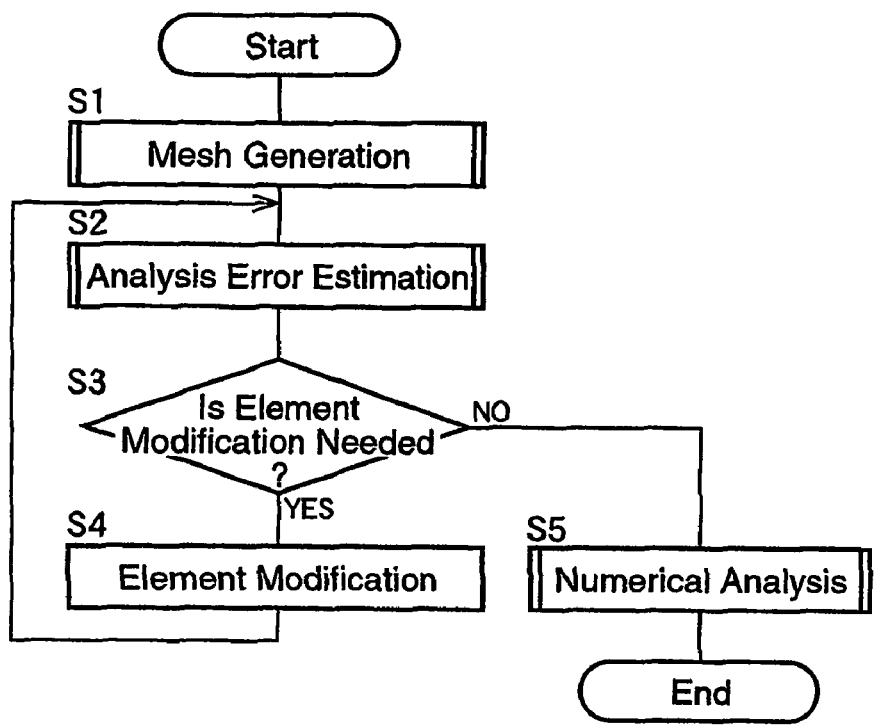
FIG. 40 is a flow chart schematically illustrating the aforementioned numerical analysis method.

FIG. 40 illustrates the numerical analysis method in a flow chart, namely, as a sequence of operations.

The numerical analysis method is initiated with step S1 in which the shape of a given structure is approximately partitioned or discretized in an automated manner into a plurality of quadrilateral elements or meshes (e.g., shell elements or meshes), based on data representative of the shape of the structure. The process of mesh generation (i.e., into-mesh partition) is implemented as a result of the execution of a mesh generation program (not shown) by the computer 12. Data indicative of the individual elements (e.g., data for defining the shapes of the individual elements) is stored in the memory 32 or the storage device 40 in association with an element number "i."

Next, step S2 is implemented to estimate, for each of the partitioned elements, an error expected to occur due to the distortion of each element in analysis results which will be obtained from implementation of the finite element method using the each element. The estimation of the analysis error is performed by executing via the computer 12 an analysis error estimation program illustrated in a flow chart in FIG. 41. The analysis error estimation program will be explained in greater detail later.

Step S2 is followed by step S3 in which a user determines, for each element, whether or not modification in shape is needed to be made to the each element, based on the estimated analysis error.

If the correction is needed, then step S4 is implemented such that an element which needs modification is modified by the user or at the direction of the user. The element modification allows changes in shape of an element which bears distortion possibly causing an excessive analysis error, if any, whereby the element is corrected in shape so as to approach a square, i.e., so as to eliminate the distortion of the element.

Subsequently, the numerical analysis method returns to step S2 to automatically implement the estimation of analysis error again. If the repeated implementation of steps S2 to S4 results in the amount of distortion for every element becoming not more than an allowable limit, then step S5 is implemented to numerically analyze deformation of the structure by the finite element method using the elements whose shapes have been fixed. The numerical analysis is performed by executing a numerical analysis program (not shown) using the computer 12.

Then, one cycle of implementation of the numerical analysis method is terminated.

It is added that the flow chart of FIG. 40 may be considered as conceptually illustrating the whole program to be executed by the computer 12 for the implementation of the numerical analysis method.

Figure 41:
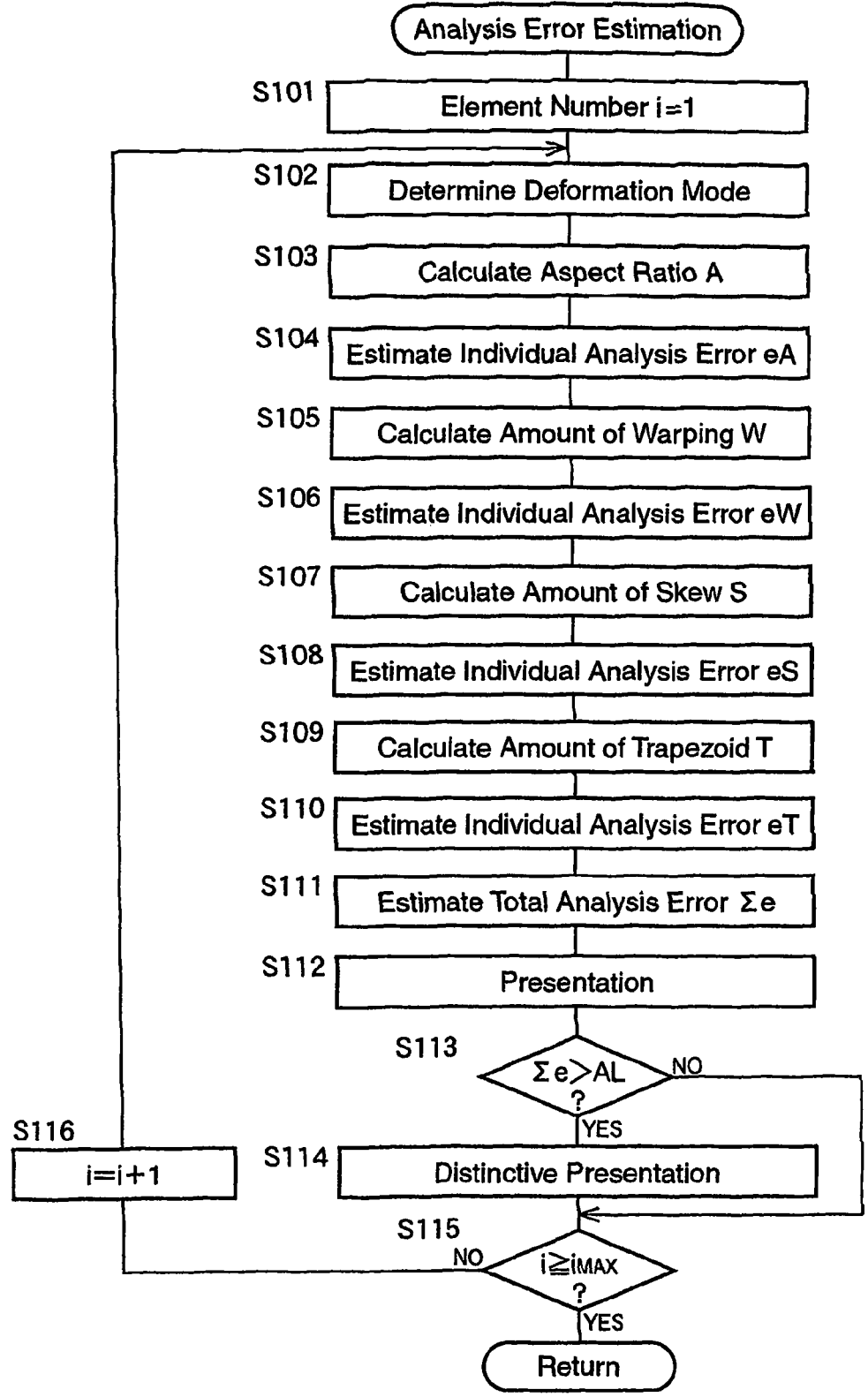
FIG. 41 is a flow chart schematically illustrating an analysis error estimation program executed by the computer 12 in FIG. 39 for practicing the aforementioned numerical analysis method.

In FIG. 41, the aforementioned analysis error estimation program is schematically illustrated in a flow chart.

The analysis error estimation program begins with step S101 to set the element number "i" to "1."

Next, step S102 is implemented to determine or identify a deformation mode of an element to which the current element number "i" has been assigned (hereinafter, referred to as "current element"). More specifically, the determination is made according to a deformation mode which has been previously designated by the user. Prior to determination of the deformation mode, depending upon the user's command, a selected deformation mode was stored in association with each element in the memory 32 or the storage device 40. The deformation mode associated with the current element is read from the memory 32 or the storage device 40, whereby a deformation mode for the current element is finally determined.

Step S102 is followed by step S103 in which data representing the current element is retrieved from the memory 32 or the storage device 40. Further, the aspect ratio A of the current element is calculated based on the retrieved data.

The calculation of the aspect ratio A is performed in accordance with a conventional definition, for example, as follows:

First, a projected flat plane for the current element is supposed so that its corner nodes are equidistant from the four nodes of the current element. Then, a unique local coordinate system is set up appropriately for the current element, while its origin is placed at the centroid of the current element. For an arbitrary shaped element, the reference rectangle in FIG. 3 is determined by applying Equation 1.13. Then, the aspect ratio A of the distorted element is determined as the ratio of the lengths of the sides of the reference rectangle. The effect of large aspect ratio becomes critical when combined with skew or trapezoid. The aspect ratio A is calculated, when explained in reference to FIG. 3, as $h_x/h_y$.

Step S103 is followed by step S104 to estimate an individual analysis error eA of the current element, which occurs due to element distortion represented by the aspect ratio A, based on both the calculated aspect ratio A and the determined deformation mode. A relationship between aspect ratio A, deformation mode, and individual analysis error eA, which has been estimated as a result of the execution of a correlation estimation program as described later, has been stored in the memory 32 or the storage device 40. According to the relationship, the individual analysis error eA is determined so as to correspond to the current aspect ratio A and the current deformation mode. The relationship among aspect ratio A, deformation mode and individual analysis error eA has been established correspondingly to the relationship illustrated in graphs in FIG. 37.

Step S104 is followed by step S105 in which the amount of warping W of the current element is calculated. The calculation is performed in accordance with a conventional definition, for example, as follows:

First, a projected flat plane for the current element is supposed so that its corner nodes are equidistant from the four nodes of the current element. The amount of warping W is merely the z coordinate of the four corner nodes, which is equal to the distance $h_w$ between the actual non-planar element and the projected flat plane.

Following step S105, step S106 is implemented correspondingly to step S104, to estimate an individual analysis error eW of the current element, which occurs due to element distortion represented by the amount of warping W, based on both the calculated amount of warping W and the determined deformation mode, according to a relationship between amount of warping W, deformation mode, and individual analysis error eW. The relationship has been estimated as a result of the execution of the aforementioned correlation estimation program. The relationship has been established correspondingly to the relationship illustrated in graphs in FIG. 37.

Step S106 is followed by step S107 in which the amount of skew S of the current element is calculated. The calculation is performed differently from a conventional manner, as follows:

First, as shown in FIG. 3, a rectangle with the same aspect ratio A as the current element is supposed by the name of a basis rectangle. Then, distances $\alpha_1$ and $\alpha_2$ are prepared for the calculation of the amount of skew S. The distance $\alpha_1$ is a measured distance in which a selected one node of the current element is moved from the basis rectangle in the x (transverse) direction. The distance $\alpha_2$ is a measured distance in which a selected one node of the current element is moved from the basis rectangle in the y direction. Finally, the amount of skew S is calculated as both the distances $\alpha_1$ and $\alpha_2$.

Following step S107, step S108 is implemented correspondingly to steps S104 and S106, to estimate an individual analysis error eS of the current element, which occurs due to element distortion represented by the amount of skew S, based on both the calculated amount of skew S and the determined deformation mode, according to a relationship between amount of skewing S, deformation mode, and individual analysis error eS. The relationship has been estimated as a result of the execution of the aforementioned correlation estimation program. The relationship has also been established correspondingly to the relationship illustrated in graphs in FIG. 37.

Step S108 is followed by step S109 in which the amount of trapezoid T of the current element is calculated. Different from a conventional calculation, the amount of trapezoid T is calculated as shown in FIG. 3 as follows:

First, a rectangle with the same aspect ratio A as the current element is supposed by the name of a basis rectangle. Then, distances $\alpha_3$ and $\alpha_4$ are prepared for the calculation of the amount of trapezoid T. The distance $\alpha_3$ is a measured distance in which a selected one node of the current element is moved from the basis rectangle in the x (transverse) direction. The distance $\alpha_4$ is a measured distance in which a selected one node of the current element is moved from the basis rectangle in the y direction during taper deformation. In the context, the "taper deformation" means a deformation of the current element to form a divergence or convergence between two element-sides opposing to each other in the transverse or longitudinal direction. Finally, the amount of trapezoid T is calculated as both the distances $\alpha_3$ and $\alpha_4$.

Following step S109, step S110 is implemented correspondingly to steps S104, S106, and S108, to estimate an individual analysis error eT of the current element, which occurs due to element distortion represented by the amount of trapezoid T, based on both the calculated amount of trapezoid T and the determined deformation mode, according to a relationship between amount of trapezoid T, deformation mode and individual analysis error eT. The relationship has been estimated as a result of the execution of the aforementioned correlation estimation program. The relationship has been established precisely as the relationship illustrated in graphs in FIG. 37.

Step S110 is followed by step S111 to estimate a total analysis error $\Sigma e$ of the current element, based on the estimated four individual analysis errors eA, eW, eS, and eT. The total analysis error $\Sigma e$ is estimated as the normal or simple sum of these four individual analysis errors eA, eW, eS, and eT. However, the total analysis error $\Sigma e$ may be estimated as the weighed sum in consideration of synergistic effects between aspect ratio A, the amount of warping W, and the amount of skew S, and the amount of trapezoid T.

Following step S111, step S112 is implemented, for the current element, to numerically visualize or present the estimated four individual analysis errors eA, eW, eS, and eT, and the estimated total analysis error $\Sigma e$ on a screen of the monitor 22, thereby providing a quantitative presentation thereof. The presentation may be performed simultaneously for all elements.

It is added that, for the quantitative presentation of analysis errors, it is not essential to numerically present the analysis errors, and that the analysis errors may be presented with graphs or diagrams variable in size or color, for example.

Step S112 is followed by step S113 to make a determination of whether or not the total analysis error $\Sigma e$ estimated for the current element exceeds an allowable value AL. If the total analysis error $\Sigma e$ exceeds the allowable value AL, then step S114 is implemented to display the current element so as to be distinguished from other elements on the screen of the monitor 22. Otherwise, step S114 is skipped.

In either case, step S115 is then implemented to make a determination of whether or not the current element number "i" is not less than a maximum value $i_{MAX}$. That is, a determination is made of whether or not the execution of steps S102 through S114 has been terminated for all elements of the current analyzed object. If the current element number "i" is not less than the maximum value $i_{MAX}$, then one cycle of the execution of the analysis error estimation program is terminated. Otherwise, step S116 is implemented to increment the element number "i" by 1, and thereafter, the analysis error estimation program returns to step S102.

FIG. 42 shows one example of presentation of the analysis errors estimated for a plurality of elements. In the example of presentation, different kinds of estimated analysis errors are presented in association with each of the plurality of elements in a chart form. Further, in the example of presentation, a column named "PROPRIETY" is filled in with "X" for an element in which the total analysis error $\Sigma e$ exceeds the allowable value AL, while is filled in with "O" for an element in which the total analysis error $\Sigma e$ does not exceed the allowable value AL.

Evidently, various kinds of estimated analysis errors are presented per each element, and therefore, it allows the user, in the presence of an element in which the total analysis error $\Sigma e$ exceeds the allowable value AL, to instantly detect the maximum one of the four individual analysis errors, and detect an effective element-distortion-related information to be referred to for modification of the present element. For example, in the case of the element whose element number "i" equals 3, the fact that the total analysis error $\Sigma e$ exceeds the allowable value AL and that the distortion of the present element is therefore not proper, is demonstrated with a particular symbol. Further, the fact that one of the four individual analysis errors, which corresponds to the aspect ratio A, is the maximum individual analysis error is demonstrated.

It is added that, in the present embodiment, the analysis error due to distortion of each element is estimated in view of all of an aspect ratio component represented by the aspect ratio A, a warping component represented by the amount of warping W, a skew component represented by the amount of skew S, and a trapezoid component represented by the amount of trapezoid T, all included in the distortion of each element.

However, in an alternative embodiment in accordance with the present invention, the analysis error is estimated by taking account of at least one of the four components, which dominantly affects the analysis error, such as the aspect ratio and the trapezoid component, for example, but not by taking account of the warping and the skew component, depending on the characteristic of the type of the finite element approximation or analysis software. The analysis error, estimated according to the aforementioned method, may be performed to examine the analysis software of the user's interest by extracting the element stiffness matrix and calculating the strain energy error for various distortion parameters, and based on this result, the user can decide the dominant distortion mode. This alternative embodiment facilitates simplified and accelerated calculation of the analysis error compared with the presently preferred embodiment.

Figure 43:
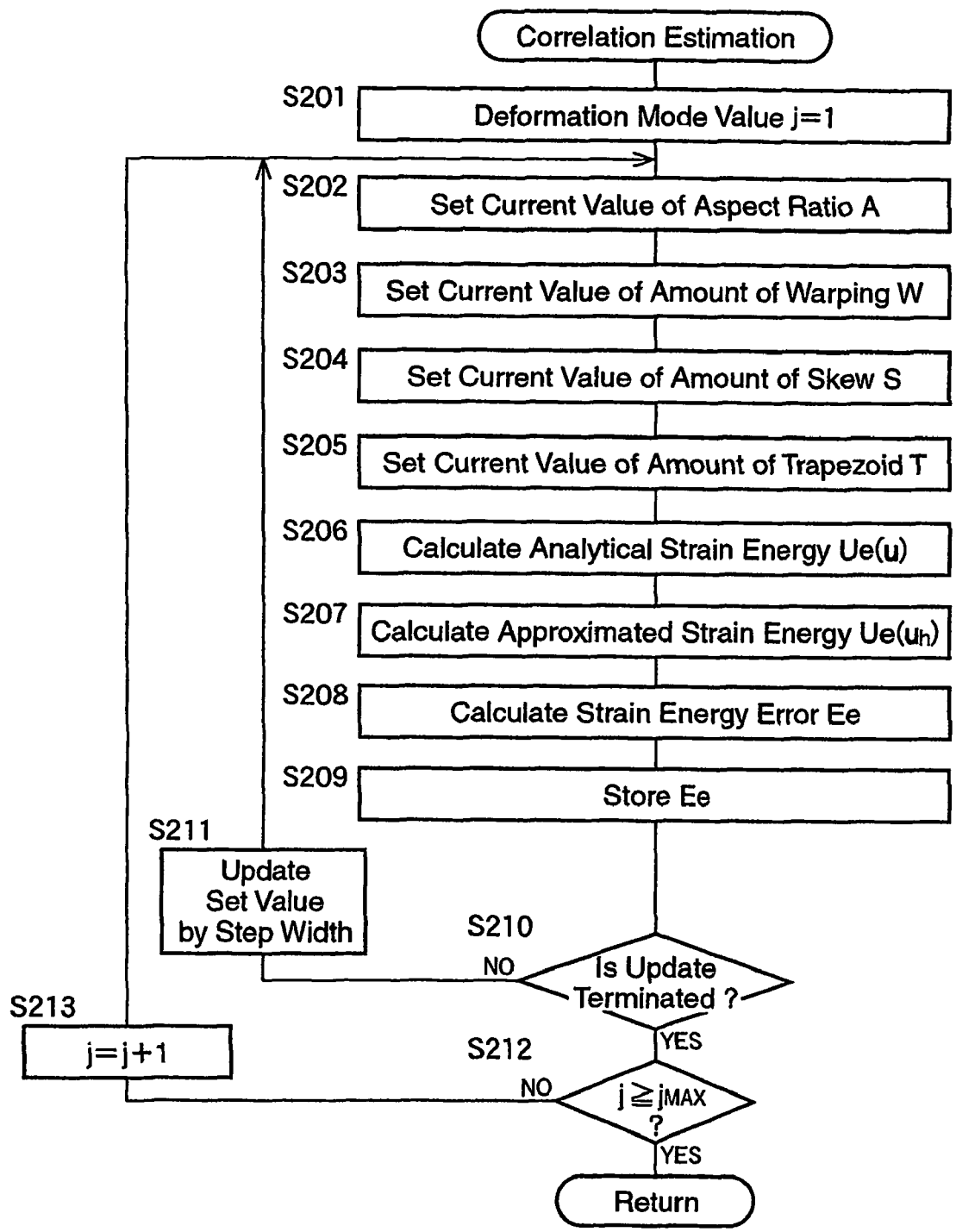
FIG. 43 is a flow chart schematically illustrating a correlation estimation program executed by the computer 12 in FIG. 39 to practice the numerical analysis method.

FIG. 43 schematically illustrates the aforementioned correlation estimation program in a flow chart. The correlation estimation program is executed by the computer 12 so as to estimate the relationship between element distortion and analysis error due to the element distortion as the correlation.

However, it is not essential to execute both the correlation estimation program and the analysis error estimation program by means of the same computer. Although the correlation is essential for executing the analysis error estimation program, it is enough if an estimated result of the correlation exists prior to execution of the analysis error estimation program. Furthermore, it is not essential to update a previously estimated result of the correlation during the execution of the analysis error estimation program.

Therefore, it is possible to obtain the correlation as a result of the execution of the correlation estimation program via a computer different from the computer 12, and to, in turn, store data indicative of the obtained correlation into the memory 32 or the storage device 40 of the computer 12, prior to execution of the analysis error estimation program by the computer 12, thereby estimating the analysis errors.

It is unnecessary that this correlation estimation program be executed by the computer 12 each time the numerical analysis method is practiced. Only one execution of the correlation estimation program prior to subsequent practices of the numerical analysis method is enough, whether or not these practices share the same analyzed object. This is because the correlation to be estimated by the execution of the correlation estimation program can be commonly utilized for numerical analyses, whether or not these analyses share the same analyzed object.

The correlation estimation program, roughly described, is executed such that a quadrilateral element is targeted, and the analysis error is then estimated for the targeted element per each deformation mode, through a process of updating a combination of: a set value of the aspect ratio A; a set value of the amount of warping W; a set value of the amount of skew S; and a set value of the amount of trapezoid T, in increments or decrements of a predetermined step width.

Further, the correlation estimation program is executed such that both the analytical and the approximated strain energy of the targeted element are calculated per each deformation mode for the purpose of estimation of the analysis errors. The analytical strain energy is calculated without depending on the finite element analysis, using theoretical solutions of stress and strain of the targeted element. The approximated strain energy is calculated by the finite element approximation, using a theoretical solution of nodal displacement of the targeted element and the element stiffness matrix of a shell element of particular finite element software.

In general, a mesh model approximately representing the shape of an analyzed object involves many distorted elements. In the present embodiment, in order to evaluate the distortion characteristics of one finite element, the approximated strain energy occurring in the one element is calculated by the use of an element stiffness matrix $K_e$ regarding the one element.

According to a normal finite element analysis, a plurality of element stiffness matrices $K_e$ regarding a plurality of elements together constituting one analyzed object are composed into an assemblage stiffness matrix K, and then each element is analyzed using the assemblage stiffness matrix K together with a boundary condition and a loading condition. Alternatively, in the present embodiment, as described above, one element is representatively used, and the approximated strain energy is calculated by the use of the element stiffness matrix $K_e$ concerning the one element.

Further, in the correlation estimation program, the analysis error is calculated by considering the difference between the analytical and the approximated strain energy. More specifically, the strain energy error is calculated as the difference divided by the analytical strain energy, and the strain energy error is then made to be the analysis error.

More specifically, the correlation estimation program is initiated with step S201 to set to "1" a deformation mode value "j" indicative of the kind of the deformation mode of the element currently targeted. The deformation mode value "j" may be designed to mean, for example, tension when "j" equals 1, bending when "j" equals 2, shear when "j" equals 3, and torsion when "j" equals 4.

Next, steps S202 through S205 are implemented to set current values of the aspect ratio A, the amount of warping W, the amount of skew S, and the amount of trapezoid T, for one element. The one element serves as a representative element representing a plurality of elements which corporate to approximately represent the shape of an analyzed object for which the resulting estimated analysis errors will be utilized.

Subsequently, step S206 is implemented to calculate the analytical strain energy $U_e(u)$ in a manner described above, for the representative element, using the strain energy equation expressed as the aforementioned Equation 3.4, for example.

Step S206 is followed by step S207 in which the approximated strain energy $U_e(u_h)$ is calculated in a manner described above, for the representative element, using the strain energy equation expressed as the aforementioned Equation 3.10, for example.

Step S207 is followed by step S208 in which the strain energy error $E_e$ is calculated for the representative element, in accordance with the aforementioned Equation 3.1, by dividing by the calculated analytical strain energy $U_e(u)$, the calculated approximated strain energy $U_e(u_h)$ subtracted from the calculated analytical strain energy $U_e(u)$.

Following step S208, step S209 is implemented to store into the memory 32 or the storage device 40, the calculated strain energy error $E_e$ as the analysis error, in association with a combination of the current deformation mode; the current set value of the aspect ratio A; the current set value of the amount of warping W; the current set value of the amount of skew S; and the current set value of the amount of trapezoid T.

That is to say, the relationship between the deformation mode "I;" the current set value of the aspect ratio A; the current set value of the amount of warping W; the current set value of the amount of skew S; the current set value of the amount of trapezoid T; and the current value of the analysis error constitutes one example of an element-distortion-to-analysis-error relationship.

Step S209 is followed by step S210 to determine whether or not the updating of the set values of the aspect ratio A, the amount of warping W, the amount of skew S, and the amount of trapezoid T has been terminated. That is to say, a determination is made of whether or not changes over an intended range have been made to all the geometric parameters.

If the updating of all the set values has not yet been terminated, then step S211 is implemented to update the set value of the corresponding one of the aspect ratio A, the amount of warping W, the amount of skew S, and the amount of trapezoid T, by the pre-determined step width.

Thereafter, if the updating of all the set values has been terminated as a result of the repeated executions of steps S202 through S211, then step S212 is implemented to determine whether or not the current value of the deformation mode value "j" equals a maximum value $j_{MAX}$. That is to say, a determination is made of whether or not the estimation of the analysis error has been terminated for all the deformation modes able to be assumed.

If the current value of the deformation mode value "j" does not equal the maximum value $j_{MAX}$, then step S213 is implemented to increment the deformation mode value "j" by 1, and subsequently, the correlation estimation program returns to step S202.

Following that, if the estimation of the analysis error has been terminated for all the deformation modes able to be assumed as a result of the repeated execution of steps S202 through S213, then one cycle of the execution of the correlation estimation program is terminated.

As is readily understood from the above, in the present embodiment, the correlation estimation program constitutes one example of a combination of the "assuming step" and the "estimating step" set forth in the above mode (1) or (9), and one example of the "calculating step" set forth in the above mode (3) or (4).

Further, in the present invention, step S102 in FIG. 41 constitutes one example of the "deformation-mode determination step" set forth in the above mode (11), steps S112 through S114 together constitute one example of the "visualizing step" set forth in the same mode, steps S103 through S11 together constitute one example of the "estimating step" set forth in the above mode (13), steps S103 through S110 each constitute one example of the "individual-analysis-error estimation step" set forth in the above mode (15), step S111 constitutes one example of the "total-analysis-error estimation step" set forth in the above mode (16), and step S114 constitutes one example of the "distinctive display step" set forth in the above mode (17).

Still further, in the present embodiment, step S1 in FIG. 40 constitutes one example of the "partition step" set forth in the above mode (18), step S102 in FIG. 41 constitutes one example of the "deformation-mode determination step" set forth in the same mode, steps S112 through S114 in FIG. 41 together constitute one example of the "visualizing step" set forth in the same mode, and step S5 constitutes one example of the "analyzing step" set forth in the same mode.

Yet further, in the present embodiment, a set of the aforementioned four deformation modes is one example of the "plurality of basic deformation modes" set forth in the above mode (2), a set of the aforementioned distortion parameters (geometry parameters) $\alpha_1$ through $\alpha_4$ is one example of the "plurality of basic distortion parameters" set forth in the same mode, the aforementioned strains $\epsilon_x$ and $\epsilon_y$ are one example of the "normal strains" set forth in the same mode, and the aforementioned strain $\gamma_{xy}$ is one example of the "shear strain" set forth in the same mode.

Additionally, in the present embodiment, Equations 1.38 through 1.40 in FIG. 19 are examples of equations provided by "formulating normal strains and shear strain of the plane-like element" set forth in the above mode (2), Equation 3.4 in FIG. 19 is one example of an equation to calculate the "strain energy of the plane-like element" set forth in the same mode.

It will be appreciated by those skilled in the art that changes could be made to the embodiments described above without departing from the broad inventive concept thereof. It is understood, therefore, that this invention is not limited to the particular embodiments disclosed, but it is intended to cover corrections within the spirit and scope of the present invention as defined by the appended claims.

The invention claimed is:

1. A process of estimating by a computer an analysis error expected to occur during deformation analysis of an object by a finite element method, with regard to an element which is used for approximately representing a shape of the object, from geometric distortion of an original shape of the element, the process comprising:

assuming at least one deformation mode occurring in the element upon deformation of the object, in the form of at least one of tension, bending, shear, and torsion; and estimating the analysis error as a function of a degree of the geometric distortion of the original shape of the element, prior to the deformation analysis by the finite element method, for each of the at least one assumed deformation mode, wherein the element is formed as a plane-like element having a plane thereof, and wherein the estimating comprises a first calculation of:

(a) coordinate-transforming the plane-like element into an isoparametric element by expressing skew and trapezoid of the plane-like element with a plurality of basic distortion parameters which are defined so as to deal with the skew and the trapezoid independently of each other, wherein the skew and the trapezoid are the geometric distortion of the plane-like element;

(b) decomposing the deformation mode of the plane-like element into a plurality of basic deformation modes including tension, shear, and bending, by dealing with the plane-like element as the isoparametric element;

(c) calculating strain energy of the plane-like element by formulating normal strains and shear strain of the plane-like element, with the plurality of basic distortion parameters and the plurality of basic deformation modes, by dealing with the plane-like element as the isoparametric element; and (d) calculating the analysis error associated with a value of each of the plurality of basic distortion parameters, for each of the plurality of basic deformation modes, based on the calculated strain energy of the plane-like element.

2. The process according to claim 1, wherein the estimating comprises a second calculation of calculating the analysis error for each of the at least one assumed deformation mode, based on a difference between an analytical solution of strain energy of the element and an approximated solution of strain energy of the element, wherein the analytical solution is calculated based on a true stress and strain distribution within an element domain, not through a finite element analysis, while the approximated solution is calculated through a finite element approximation.

3. The process according to claim 2, wherein the second calculation comprises a solution calculation including:

defining a single representative element of a plurality of elements cooperating to approximately represent the shape of the object; and calculating the analytical solution and the approximated solution of the strain energy for the representative element, only in consideration of the representative element.

4. The process according to claim 1, wherein the distortion is expressed with a plurality of geometry parameters mutually independently expressing geometric properties of the element.

5. The process according to claim 4, wherein the plurality of geometry parameters at least comprise:
- an aspect ratio of a real shape of the element;
- skew of the real shape of the element relative to a basis rectangle having the same aspect ratio as the real shape; and
- trapezoid of the real shape of the element relative to the basis rectangle.

6. The process according to claim 5, wherein the skew is defined with an amount of skew of the real shape of the element relative to the basis rectangle, and
wherein the trapezoid is defined with an amount of taper of the real shape of the element relative to the basis rectangle.

7. The process according to claim 5, wherein the plurality of geometry parameters further comprise an amount of warping of the real shape of the element relative to the basis rectangle.

8. The process according to claim 4, wherein the estimating comprises:
- estimating a plurality of individual analysis errors in association with the plurality of geometry parameters, respectively; and
- estimating a total analysis error, based on the plurality of individual analysis errors estimated in association with the plurality of geometry parameters, respectively.

9. A computer-readable storage encoded with a computer program, wherein the program, when executed by a processor, causes the processor to perform a process for estimating an analysis error expected to occur during deformation analysis of an object by a finite element method, with regard to an element which is used for approximately representing a shape of the object, from geometric distortion of an original shape of the element, the process comprising:
- assuming at least one deformation mode occurring in the element upon deformation of the object, in the form of at least one of tension, bending, shear, and torsion; and
- estimating, with the processor, the analysis error as a function of a degree of the geometric distortion of the original shape of the element, prior to the deformation analysis by the finite element method, for each of the at least one assumed deformation mode, wherein the element is formed as a plane-like element having a plane thereof, and wherein the estimating comprises a first calculation of:
(a) coordinate-transforming the plane-like element into an isoparametric element by expressing skew and trapezoid of the plane-like element with a plurality of basic distortion parameters which are defined so as to deal with the skew and the trapezoid independently of each other, wherein the skew and the trapezoid are the geometric distortion of the plane-like element;
(b) decomposing the deformation mode of the plane-like element into a plurality of basic deformation modes including tension, shear, and bending, by dealing with the plane-like element as the isoparametric element;
(c) calculating strain energy of the plane-like element by formulating normal strains and shear strain of the plane-like element, with the plurality of basic distortion parameters and the plurality of basic deformation modes, by dealing with the plane-like element as the isoparametric element; and
(d) calculating the analysis error associated with a value of each of the plurality of basic distortion parameters, for each of the plurality of basic deformation modes, based on the calculated strain energy of the plane-like element.

* * * * *